(12) United States Patent
Nicolaescu et al.

(10) Patent No.: US 8,461,548 B2
(45) Date of Patent: Jun. 11, 2013

(54) ION BEAM IRRADIATION DEVICE AND METHOD FOR SUPPRESSING ION BEAM DIVERGENCE

(75) Inventors: Dan Nicolaescu, Kyoto (JP); Shigeki Sakai, Kyoto (JP); Junzo Ishikawa, Kyoto (JP); Yasuhito Gotoh, Otsu (JP)

(73) Assignees: Nissin ION Equipment Co., Ltd., Kyoto-shi (JP); Kyoto University, Kyoto-shi (JP)

( * ) Notice: Subject to any disclaimer, the term of this patent is extended or adjusted under 35 U.S.C. 154(b) by 153 days.

(21) Appl. No.: 13/377,253

(22) PCT Filed: Apr. 27, 2010

(86) PCT No.: PCT/JP2010/057405
§ 371 (c)(1),
(2), (4) Date: Dec. 9, 2011

(87) PCT Pub. No.: WO2010/143479
PCT Pub. Date: Dec. 16, 2010

(65) Prior Publication Data
US 2012/0085918 A1  Apr. 12, 2012

(30) Foreign Application Priority Data
Jun. 11, 2009  (JP) .................................. 2009-158255

(51) Int. Cl.
*H01J 3/26* (2006.01)
(52) U.S. Cl.
USPC ................................ 250/396 ML; 250/396 R
(58) Field of Classification Search
USPC ........................................ 250/396 R, 396 ML
See application file for complete search history.

(56) References Cited

U.S. PATENT DOCUMENTS

| 5,757,018 | A | * | 5/1998 | Mack et al. | 250/492.21 |
| 6,515,408 | B1 | * | 2/2003 | England et al. | 313/359.1 |
| 6,960,888 | B1 | * | 11/2005 | Foster | 315/111.81 |
| 7,935,944 | B2 | * | 5/2011 | Ishikawa et al. | 250/492.3 |
| 2008/0067397 | A1 | * | 3/2008 | Tsukihara et al. | 250/396 ML |

FOREIGN PATENT DOCUMENTS

| JP | 11126576 | | 5/1999 |
| JP | 2003257356 | | 9/2003 |
| JP | 2006510165 | A | 3/2006 |
| JP | 2007080691 | | 3/2007 |
| JP | 2007141545 | | 6/2007 |
| JP | 2007335110 | | 12/2007 |
| JP | 2008521207 | A | 6/2008 |
| JP | 2008524811 | A | 7/2008 |
| WO | WO 2007145355 | A2 * | 12/2007 |

OTHER PUBLICATIONS

ISA Japan, International Search Report of PCT/JP2010/057405, Jun. 22, 2010, WIPO, 2 pages.
Enge, H., "Effect of Extended Fringing Fields on Ion-Focusing Properties of Deflecting Magnets," The Review of Scientific Instruments, vol. 35, No. 3, pp. 278 287, Mar. 1964, 11 pages.

* cited by examiner

*Primary Examiner* — Michael Logie
(74) *Attorney, Agent, or Firm* — Alleman Hall McCoy Russell & Tuttle LLP

(57) ABSTRACT

To improve an efficiency of utilizing electrons and efficiently suppress an ion beam spread by a space charge effect while eliminating a need for a special magnetic pole structure by effectively using a space in the vicinity of a magnet, there are provided an ion source, a collimating magnet and a plurality of electron sources, wherein the electron sources are arranged in a magnetic field gradient region formed on an ion beam upstream side or ion beam downstream side of the collimating magnet and arranged outside a region passed by the ion beam, and an irradiation direction of the electrons is directed to supply the electrons to the magnetic field gradient region.

11 Claims, 28 Drawing Sheets

ION BEAM IRRADIATION DEVICE AND METHOD FOR SUPPRESSING ION BEAM DIVERGENCE

TECHNICAL FIELD

The present invention relates to an ion beam irradiation device for irradiating an ion beam derived from an ion source to a target so as to execute an ion implantation process etc. and, in particular, to an ion beam irradiation device having a function of suppressing an ion beam divergence by a space charge effect and to a method for suppressing an ion beam divergence.

BACKGROUND ART

Conventionally, an ion beam irradiation device of this kind, as disclosed in Patent Literature 1, is considered to have a construction that includes an ion source for generating an ion beam, a deflection magnet for deflecting the ion beam from the ion source and an electron source provided on an inner face of a magnetic pole constituting the deflection magnet so that electron beams are irradiated from the electron source to an opposed magnetic pole to thereby suppress the ion beam divergence by a space charge effect (this suppression being also referred to as "neutralization").

However, since the electrons emitted inside the magnetic pole travel along the magnetic field, the electrons impinge on a magnetic pole opposed to the magnetic pole provided with the electron source and disappear sooner or later. For this reason, there is a problem of low efficiency of using electrons for suppressing the ion beam divergence. In addition, in FIG. 6 etc. of Patent Literature 1, although it is described that the electrons across the ion beam are reflected by providing an insulator or a conductor between the electron source and the magnetic pole, it is unclear how to reflect the electrons and how to make it possible to suppress the ion beam divergence by the space charge effect.

Moreover, since the electron source is embedded in an inner face of the magnetic pole, it is necessary to execute a special process such as providing a concave portion in the inner face of the magnetic pole (see FIG. 5 etc. of Patent Literature 1), and therefore there arises the problems that not only is the structure of the magnetic pole surface complicated but also processing costs thereof are increased. In addition, there is a problem that the processing costs are also increased by the process of providing the insulator or conductor as mentioned above.

In addition, since it is difficult to ensure that a uniform magnetic field is formed by the magnetic pole by complicating the form in such ways as providing the concave portion in the inner face of the magnetic pole or providing the insulator or the conductor, there is a problem that it is difficult to accurately change the direction of the deflection ion beam to be deflected in a desired direction.

CITATION LIST

Patent Literature

Patent Literature 1: Patent Publication 2006-510165 (A)

SUMMARY OF INVENTION

Technical Problem

Therefore, the present invention has been made to collectively solve the problems mentioned above, and an essential object thereof is to improve the efficiency of using electrons by effectively utilizing a space in the vicinity of a magnet that was conventionally restricting arrangement of parts so that a spread of an ion beam is efficiently suppressed by a space charge effect while eliminating the need for a special magnetic pole structure.

Solution to Problem

That is, an ion beam irradiation device pertaining to the present invention is an ion beam irradiation device irradiating an ion beam to a target including: an ion source producing an ion beam composed of positive ions; one or more magnets provided between the ion source and the target for deflecting, converging or diverging the ion beam generated from the ion source to be irradiated to the target; and one or more electron sources producing electrons, wherein the electron sources are located in a magnetic field gradient region formed on an ion beam upstream side and/or ion beam downstream side of the magnets and located outside a region passed by the ion beam, and wherein the electron emitting direction of each of the electron sources is oriented to supply the electrons to the magnetic field gradient region.

With this configuration, since the electron sources are arranged in the magnetic field gradient region formed by the magnets and arranged outside the region passed by the ion beam so that the electrons are supplied into the magnetic field gradient region, the supplied electrons can be confined within the magnetic field gradient region by a mirror effect of the magnetic field gradient. As a result, an electron cloud can be formed on an ion beam upstream side or ion beam downstream side of the magnets so that the ion beam divergence can be suppressed by the space charge effect. Also, since the electron sources are provided in the vicinity of the magnets, by effectively using a space in the vicinity of the magnets, the need for a special magnetic pole structure can be eliminated.

In the case where each of the magnets include a pair of parallel magnetic pole surfaces provided in a manner that sandwiches the ion beam, in order to supply the electrons into the magnetic field gradient region formed by the magnetic pole surfaces, it is desirable that the electron emitting direction of each of the electron sources is oriented to be substantially perpendicular to the magnetic pole surfaces so as to be directed to a magnetic pole surface opposing the magnetic pole surfaces or directed to be outward from the deflection magnet.

In order to efficiently supply the electrons generated from the electron sources into the magnetic field gradient region, it is desirable that the electron emitting direction of each of the electron sources is a tangential direction of the magnetic field in the magnetic field gradient region.

In the case where the magnets include a collimating magnet substantially collimating the ion beam by a pair of parallel magnetic pole surfaces, in order to appropriately suppress the spread of the ion beam by the space charge effect in the collimating magnet, it is desirable that the electron sources are provided in the magnetic field gradient region formed by the collimating magnet, and, assuming that a magnetic flux density generated between the magnetic pole surfaces of the collimating magnet is $B_0$ and a magnetic flux density in the magnetic field gradient region formed outside the collimating magnet is B, the electron sources are provided in the magnetic field gradient region satisfying a relationship of $0 < B/B_0 < 0.72$. Particularly, in order to confine sufficient electrons within the magnetic field gradient region and efficiently supply the electrons to the ion beam, the electron sources are preferably provided in the magnetic field gradient region satisfying a relationship of $0.12 < B/B_0 < 0.36$.

In the case where the magnets include: a collimating magnet substantially collimating the ion beam by a pair of parallel magnetic pole surfaces; and a compensating magnet compensating a divergence in a direction perpendicular to the magnetic pole surface of the ion beam and incident to the collimating magnet by a pair of parallel magnetic pole surfaces arranged in parallel to the magnetic pole surfaces of the collimating magnet, in order to appropriately suppress a spread of the ion beam by the space charge effect in the compensating magnet, it is desirable that, assuming that the maximum magnetic flux density generated between the pair of parallel magnetic pole surfaces constituting the compensating magnet is $B_0$ and the magnetic flux density in the magnetic field gradient region formed outside the compensating magnet is B, the electron sources are provided in the magnetic field gradient region satisfying a relationship of $0 < B/B_0 < 1$. Particularly, in order to confine sufficient electrons within the magnetic field gradient region and efficiently supply the electrons to the ion beam, the electron sources are preferably provided in the magnetic field gradient region satisfying a relationship of $0.30 < B/B_0 < 0.80$.

In order to form uniform electron clouds by efficiently supplying the electrons into a uniform magnetic field in the magnetic field gradient region, it is desirable that the electron sources are arranged in a plane substantially in parallel to a pair of magnetic pole surfaces constituting the magnets and arranged along the ion beam on an upstream side and/or downstream side of the magnets.

In order to efficiently suppress the spread of the ion beam by the space charge effect by irradiating the electrons from both sides of the ion beam, it is desirable that two or more electron sources are provided and the electron sources are arranged across the ion beam.

Even in the case where the electron sources are made compact and are arranged in the electron cloud produced by a mirror effect, in order to possibly suppress the reduction of the electrons due to impingement of the electrons to the electron sources and further improve the utilization efficiency of the electrons, it is desirable that each of the electron sources is a field emission type electron source.

Further, an ion beam divergence suppressing method pertaining to the present invention is an ion beam divergence suppressing method for suppressing an ion beam divergence by the space charge effect in an ion beam irradiation device irradiating an ion beam to a target, wherein the ion beam irradiation device includes: an ion source producing an ion beam including positive ions; one or more magnets provided between the ion source and the target for deflecting, converging or diverging the ion beam generated from the ion source to be irradiated to the target; and one or more electron sources producing electrons, wherein the electron sources are arranged in a magnetic field gradient region formed on an ion beam upstream side and/or ion beam downstream side of the magnets and located outside a region passed by the ion beam so that the electrons generated from the electron sources are supplied to the magnetic field gradient region.

Advantageous Effects of Invention

According to the present invention configured like this, it becomes possible to improve the efficiency of using the electrons by effectively utilizing the space in the vicinity of the magnet that was conventionally restricting the arrangement of parts, whereby the spread of an ion beam is efficiently suppressed by the space charge effect while eliminating the need for a special magnetic pole structure.

REFERENCE CHARACTERS LIST

Figure 1:
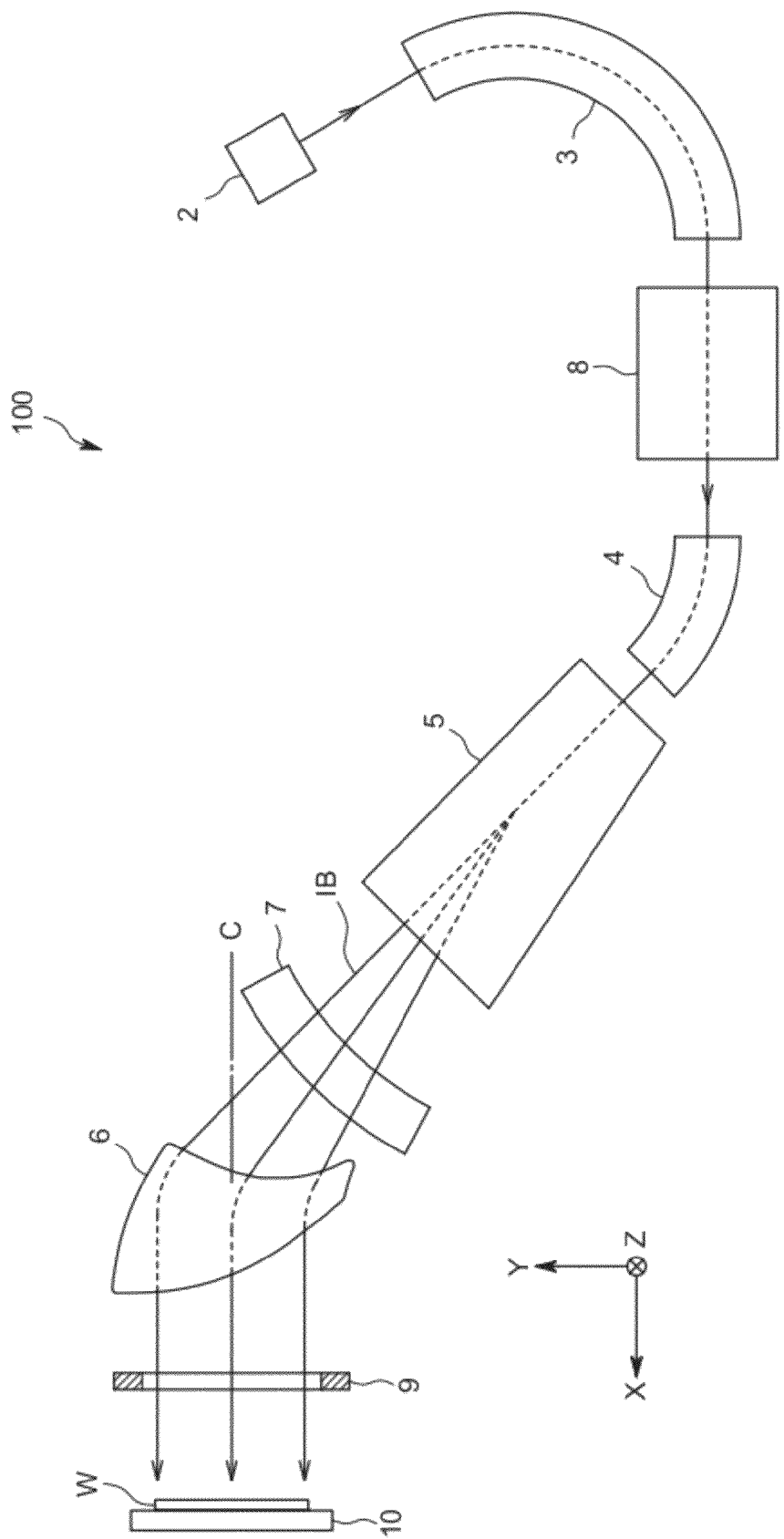
FIG. 1 is a schematic diagram showing an entire construction of an ion beam irradiation device pertaining to one embodiment of the present invention.

100 . . . Ion beam irradiation device
IB . . . Ion beam
W . . . Target
2 . . . Ion source
6 . . . Collimator magnet
61a, 61b . . . Magnetic pole surface of collimator magnet
7 . . . Compensation magnet
71a, 71b . . . Magnetic pole surface of compensation magnet
K . . . Magnetic field gradient region
11 . . . Electron source

DETAILED DESCRIPTION OF THE EMBODIMENTS

One embodiment of an ion beam irradiation device pertaining to the present invention is described below with reference to the drawings. In the present embodiment, it is noted that, as shown in FIG. 1, an advancing direction on a design of an ion beam IB irradiated to a target W is assumed to be an X direction, and two directions substantially perpendicular to each other in a plane substantially perpendicular to the X direction are assumed to be a Y direction and a Z direction. Also, the units of the X, Y and Z axes described in FIGS. 10 to 16, 19 to 23 and 27 to 31 to be referenced in the following description are mm.

The ion beam irradiation device 100 pertaining to the present embodiment, the entire arrangement thereof schematically being shown in FIG. 1, includes an ion source 2 generating an ion beam including positive ions and a plurality of magnets provided between the ion source 2 and the target W to deflect and converge or diverge the ion beam IB by a generated magnetic field in order to irradiate the ion beam IB derived from the ion source 2 to the target W.

The ion beam irradiation device 100 of the present embodiment includes, as magnet components, a mass separator 3 for mass-separating the ion beam IB derived from the ion source 2, an energy separator 4 for energy-separating the ion beam IB, a scanner 5 for scanning the ion beam IB in the Y direction (e.g., horizontal direction), a beam collimator 6 for collimating the ion beam IB scanned by the scanner 5, and a compensator 7 provided between the scanner 5 and the beam collimator 6 to compensate the divergence of the ion beam IB in the Z direction so as to improve transport efficiency of the ion beam IB.

Moreover, an accelerator/decelerator 8 is provided between the mass separator 3 and the energy separator 4 for accelerating or decelerating the ion beam IB, if necessary. Further, a mask 9 having an opening for passing the ion beam IB therethrough is provided between the beam collimator 6 and the target W so as to shape the ion beam IB. Thus, an unnecessary skirt portion of the ion beam IB in the Y direction is cut off.

The mass separator 3 is a mass separating magnet that performs mass-separation of the ion beam IB by a magnetic field. The energy separator 4 is an energy separating magnet that performs energy separation of the ion beam IB by the magnetic field. The scanner 5 is a scanning magnet that scans the ion beam IB by the magnetic field. The beam collimator 6 is a collimating magnet that collimates the ion beam IB by the magnetic field. The compensator 7 is a compensating magnet that compensates the divergence of the ion beam IB in the Z direction by the magnetic field. Further, the accelerator/decelerator 8 is an accelerating/decelerating pipe including a multi-sheet electrode that accelerates/decelerates the ion beam IB by an electrostatic field. The above magnet components 3 to 7 may include electromagnets or permanent magnets.

By the ion beam irradiation device 100 configured like this, the ion beam IB is irradiated to the target W held on a holder 10 so as to perform such as an ion implantation process into the target W. A route of the ion beam IB is adapted to be retained in a vacuum atmosphere. Also, there may be a case of providing no mass separator 2. In the case where the ion implantation is performed to the target W, this device 100 is also referred to as an implantation device.

Figure 2:
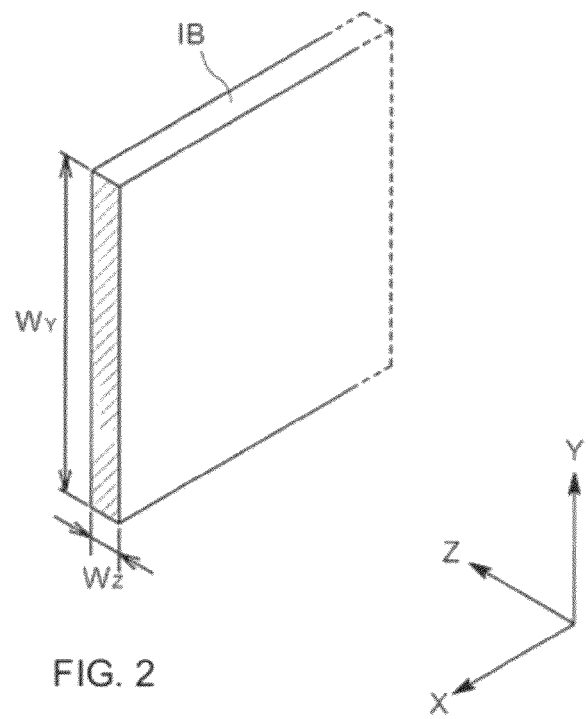
FIG. 2 is a schematic perspective view partially showing one example of a ribbon-shaped ion beam.
Figure 3:
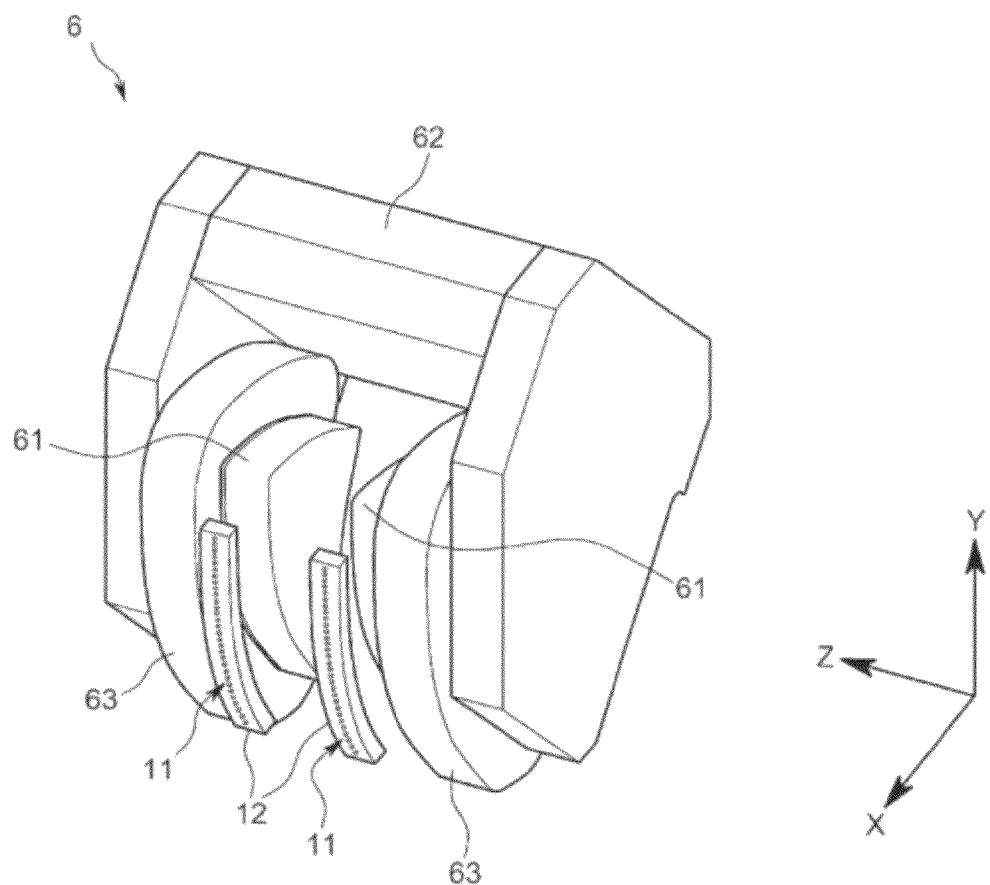
FIG. 3 is a schematic perspective view partially showing a collimator magnet and electron source.

As shown in FIG. 2, the ion beam IB irradiated to the target W has a size in the Y direction (e.g., longitudinal direction) that is larger than a size in the Z direction perpendicular to the Y direction. The ion beam IB having a shape like this is referred to as a ribbon shaped or strip shaped ion beam in some cases. However, this does not mean that the size in the Z direction is thin like a sheet of paper. As one example thereof, the size in the Y direction is in a degree of 350 mm to 400 mm and the size in the Z direction is in a degree of 80 mm to 100 mm.

The target W is, e.g., a semiconductor substrate, a glass substrate or the like. In this embodiment, the target W is held on the holder 10 and is mechanically and reciprocally driven back and forth (mechanically scanned) along the Z direction by a target driving device (not shown). The size $W_Y$ of the ion beam IB in the Y direction is slightly larger than the size of the target W in the same direction, and thus the entire surface of the target W can be radiated with the ion beam IB along with the reciprocal driving mentioned above.

In this configuration, the ion beam irradiation device 100 of the present embodiment is adapted to have a plurality of electron sources 11 for generating electrons provided in the vicinity of the collimating magnet 6 and the compensating magnet 7 so as to form an electron cloud in the vicinity of the collimating magnet 6 and the compensating magnet 7 to thereby supply the electrons to the ion beam IB so that the divergence of the ion beam IB is suppressed by the space charge effect.

The following describes in specific.

The collimating magnet 6, in cooperation with the scanner 5 scanning the ion beam IB by a magnetic field, is adapted to bend back, by a magnetic field, the ion beam IB scanned in the Y direction to be collimated so as to be substantially parallel to a reference axis C (an axis along the X direction), to thereby emit the ribbon shaped ion beam IB having a size in the Y direction larger than that in the Z direction. As shown in FIGS. 3 to 6, this collimating magnet 6 includes a pair of magnetic poles 61 opposed to each other in the Z direction, a yoke 62 connecting therebetween and a pair of energizing coils 63 energizing each of the magnetic poles 61, and further includes a pair of magnetic pole surfaces 61a and 61b (i.e., flat surfaces parallel to a XY plane) arranged in parallel and opposed to each other in the Z direction.

Figure 7:
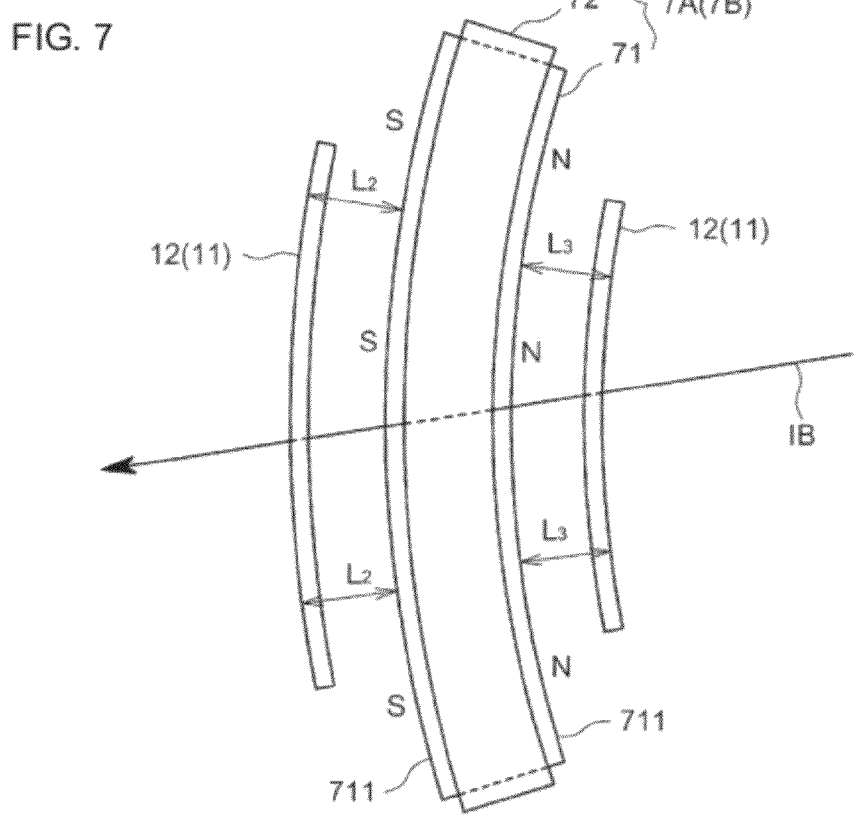
FIG. 7 is a diagram showing a positional relationship between a compensation magnet and the electron source when viewed in the z direction.
Figure 8:
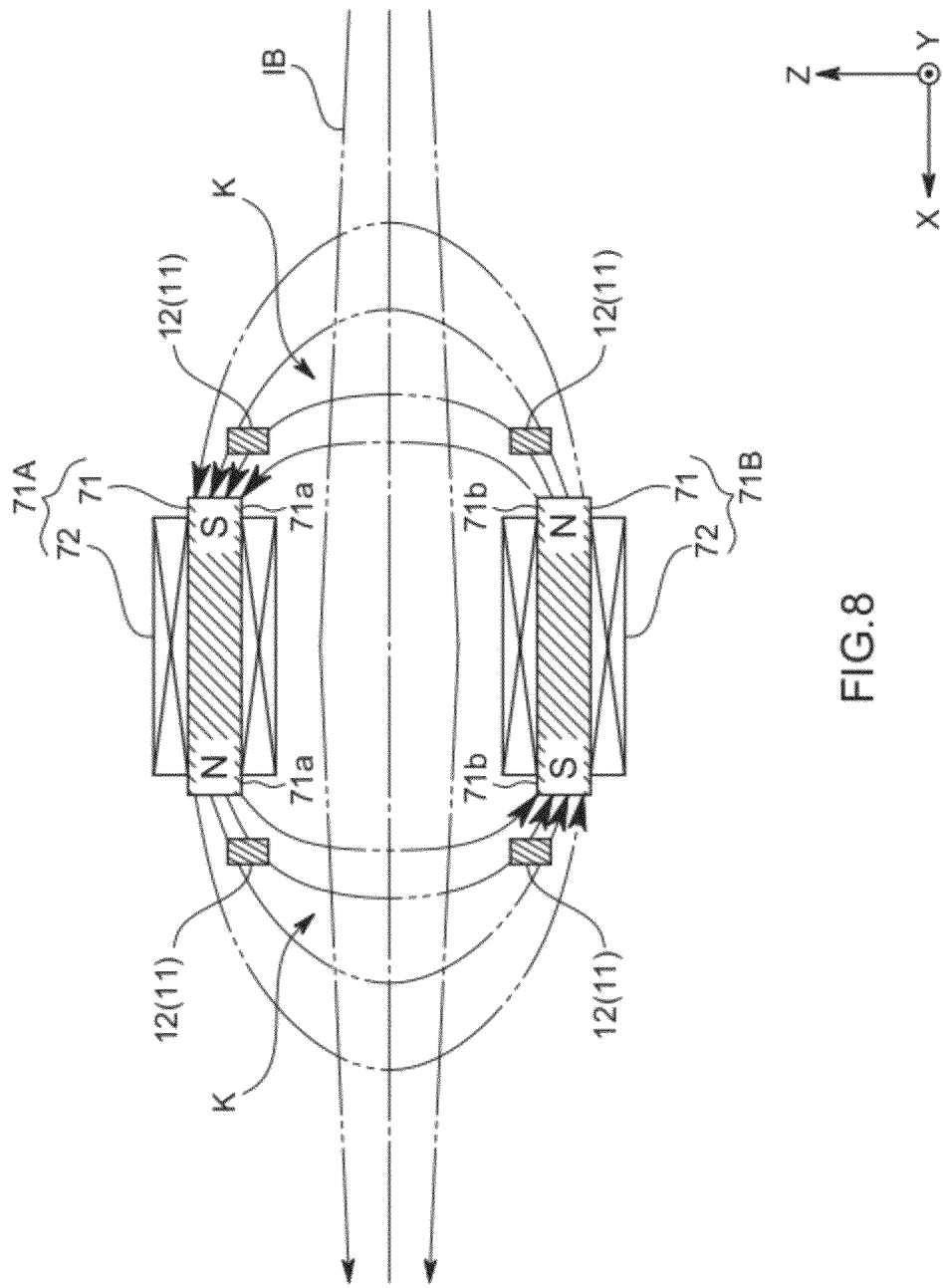
FIG. 8 is a sectional view showing a positional relationship between the compensation magnet and the electron source.

The compensating magnet 7 is adapted to compensate the divergence of the ion beam IB in the Z direction so as to improve the transport efficiency of the ion beam IB. As shown in FIGS. 7 and 8, this compensating magnet 7 includes a first magnet 7A and a second magnet 7B arranged to be opposed to each other in the Z direction. Each of the magnets 7A and 7B includes an arc-shaped iron core 71 extending in the forward direction of the ion beam IB and a coil 72 wound in the longitudinal direction of the iron core 71. A pair of long side portions 711 (i.e., inlet side and outlet side of the ion beam IB) of the iron core 71 respectively constitute different magnetic poles substantially throughout the entire length thereof. That is, similarly to the collimating magnet 6, the compensating magnet 7 includes a pair of magnetic pole surfaces 71a and 71b (i.e., flat surfaces parallel to the XY plane) arranged in parallel and opposed to each other in the Z direction (see FIG. 8). Herein, each of the first and second magnets 7A and 7B is supplied with an exciting current from a DC power source (not shown).

Figure 4:
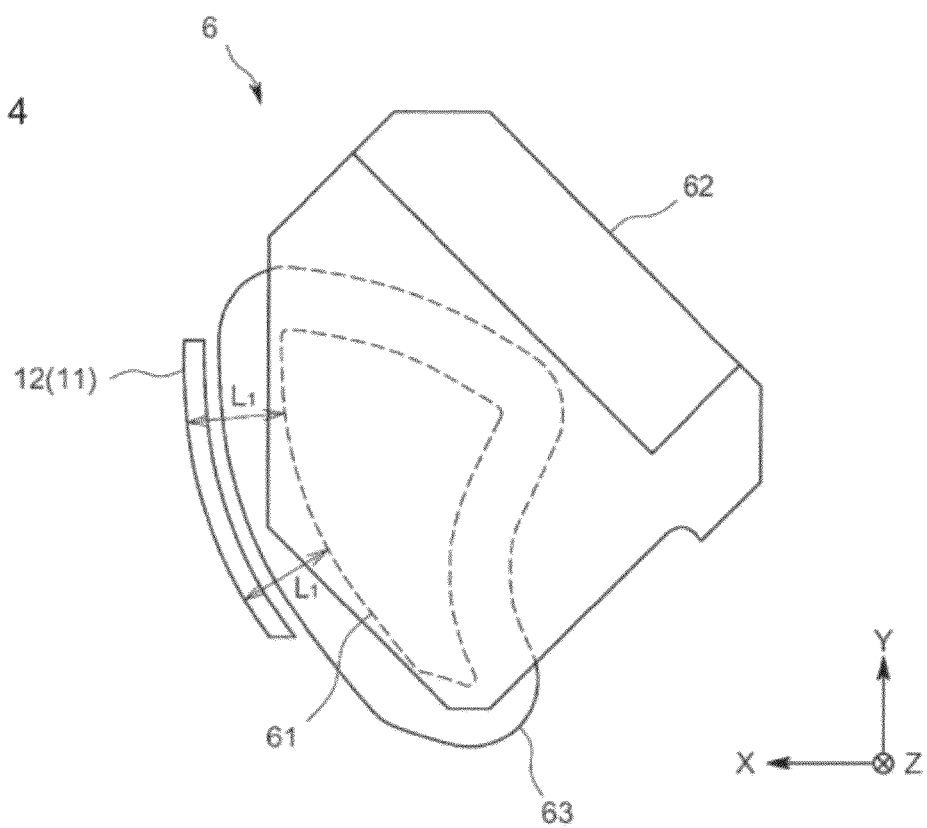
FIG. 4 is a diagram showing a positional relationship between the collimator magnet and the electron source when viewed in the z direction.
Figure 5:
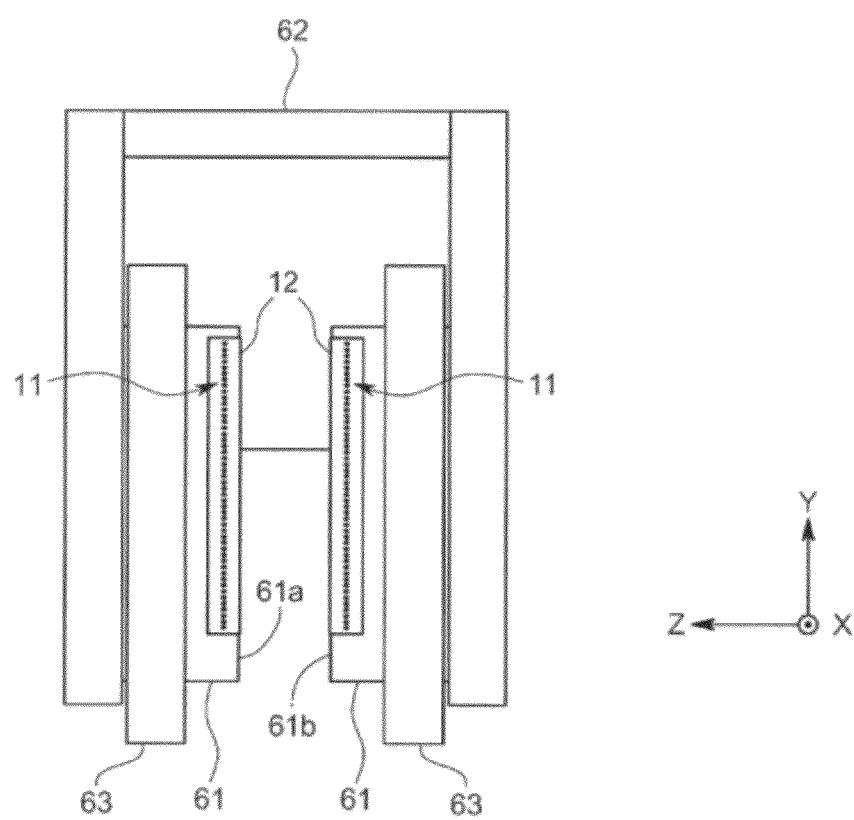
FIG. 5 is a diagram showing a positional relationship between the collimator magnet and the electron source when viewed in the x direction.

As shown in FIGS. 4 and 7 etc., a plurality of electron sources 11 are provided on an upstream side and a downstream side of the ion beam with respect to the collimating magnet 6 and the compensating magnet 7 in a manner that the electron sources sandwich the ion beam IB. In specific, as shown in FIG. 5, the electron sources 11 are held by an electron source holder 12 so as to be arranged in series and uniformly spaced from each other. It is noted that, although the electron sources 11 are arranged to be plane symmetric across the ion beam IB in FIG. 5, they may be shifted alternately in the Y direction.

Figure 9:
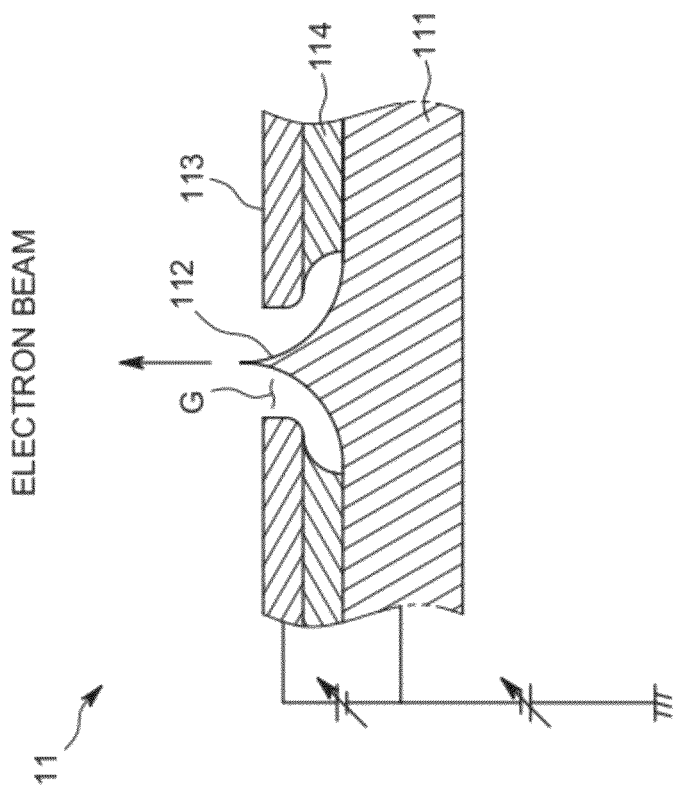
FIG. 9 is a sectional view schematically showing a construction of the electron source.

Each of the electron sources 11 of the present embodiment is a field emission type and, as shown in the partially enlarged section view of FIG. 9, each includes a conductive cathode substrate 111, a plurality of minute (micrometer order) emitters 112 each of which is formed on the surface of the cathode substrate 111 and has a sharp-pointed tip, an extracting electrode 113 (also referred to as "gate electrode") in common to each of the emitters 112 surrounding the vicinity of the tip of each emitter 112 spaced with a minute (micrometer order) gap G, and an insulating layer 114 provided between the extracting electrode 113 and the cathode substrate 111 so as to insulate therebetween. The cathode substrate 111 and each of the emitters 112 are conducting to each other.

The following describes an arrangement aspect of the electron sources 11 in specific.

Figure 6:
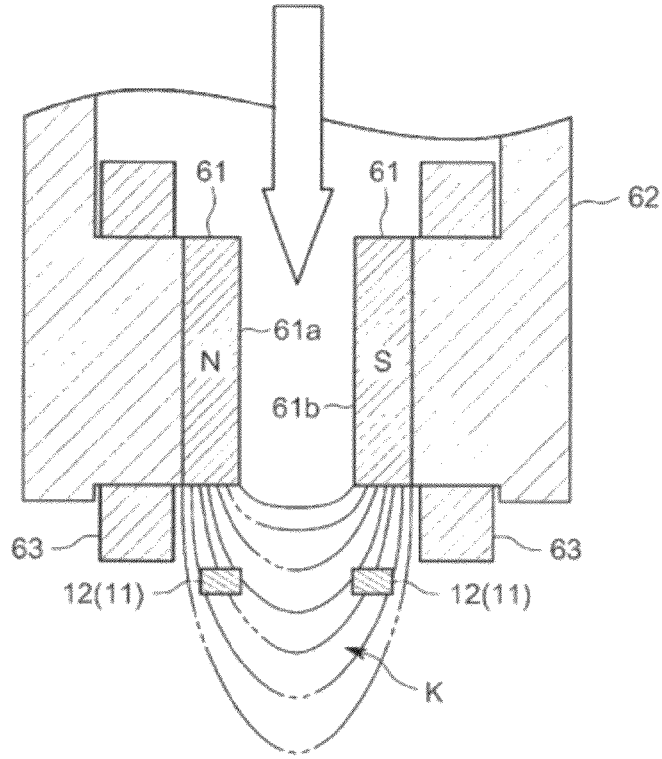
FIG. 6 is a schematic section view showing a positional relationship between the collimator magnet and the electron source.

As shown in FIG. 6 or 8, the electron sources 11 are arranged in a magnetic field gradient region K which is formed on the upstream or downstream side of the magnets 6 and 7 with respect to the ion beam IB, and also arranged on the outside of the passing region of the ion beam IB in a manner that sandwiches the passing region of the ion beam IB. The magnetic field gradient region K is a magnetic field region that is formed in a manner of expanding outward from the magnetic pole surfaces 61a, 61b or 71a, 71b of the collimating magnet 6 or the compensating magnet 7.

Then, the electron emitting direction of the electron sources 11 is set in an orientation of supplying the electrons to the magnetic field gradient region K, i.e., in a direction toward the magnetic field gradient region K. In specific, the electron emitting direction of the electron sources 11 is oriented in a substantially horizontal direction or outward from the magnets 6 and 7 so as to be directed to the magnetic pole surface (61b or 71b) opposed to the magnetic pole surface (e.g., 61a or 71a). More specifically, it is desirable that the electron emitting direction of the electron sources 11 is set to be substantially coincident with a tangential direction of the magnetic field in the magnetic field gradient region K. In FIGS. 6 and 8, the electron emitting direction of the electron sources 11 is shown in a state of being directed outward from the magnets 6 and 7 so as to be substantially in parallel to the magnetic pole surfaces 61a, 61b or 71a, 71b.

Also, as shown in FIG. 5, the electron sources 11 are arranged in a generally column-like shape in a plane (XY flat plane) substantially in parallel to a pair of magnetic pole surfaces (61a, 71a etc.) constituting the collimating magnet 6 or the compensating magnet 7.

Further, the electron sources 11 are provided along the ion beam upstream side surface and ion beam downstream side surface of the magnets 6 and 7 so that the distances between the side surfaces and the respective electron sources 11 are substantially constant. For example, the distances between the collimating magnet 6 and the electron sources 11 provided on the downstream side are made constant in the circumferential direction of the collimating magnet 6. The distances L2 or L3 between the compensating magnet 7 and the electron sources 11 provided on the upstream or downstream side are made constant in the circumferential direction of the compensating magnet 7. That is, the electron sources 11 are adapted to be arranged within a constant magnetic field in the circumferential direction of the magnets 6 and 7 in the magnetic field gradient region K.

Next, the following describes a specific arrangement in the case where the electron sources 11 are provided in the vicinity of the downstream side of the ion beam IB (in the vicinity of the outlet) with respect to the collimating magnet 6.

In the case where the electron sources 11 are provided in the vicinity of the downstream of the ion beam IB with respect to the collimating magnet 6, assuming that a magnetic flux density generated between the magnetic pole surfaces 61a and 61b opposed to each other of the collimating magnet 6 is $B_0$ and a magnetic flux density in the magnetic field gradient region K formed outside the collimating magnet 6 is B, the electron sources 11 are provided in the magnetic field gradient region K satisfying a relationship of $0<B/B_0<0.72$. More specifically, the electron sources 11 are provided in the magnetic field gradient region K satisfying a relationship of $0.12<B/B_0<0.36$. Herein, the range of $B/B_0<$ is appropriately changed according to the type of the magnet 6 (magnetic field constitution), energy of electrons, ionic species to be treated, a deflection amount or the like.

Herein, the positions of the electron sources 11 with respect to the collimating magnet 6 and a confining action of electrons at this time are described based on the simulation results.

Figure 10:
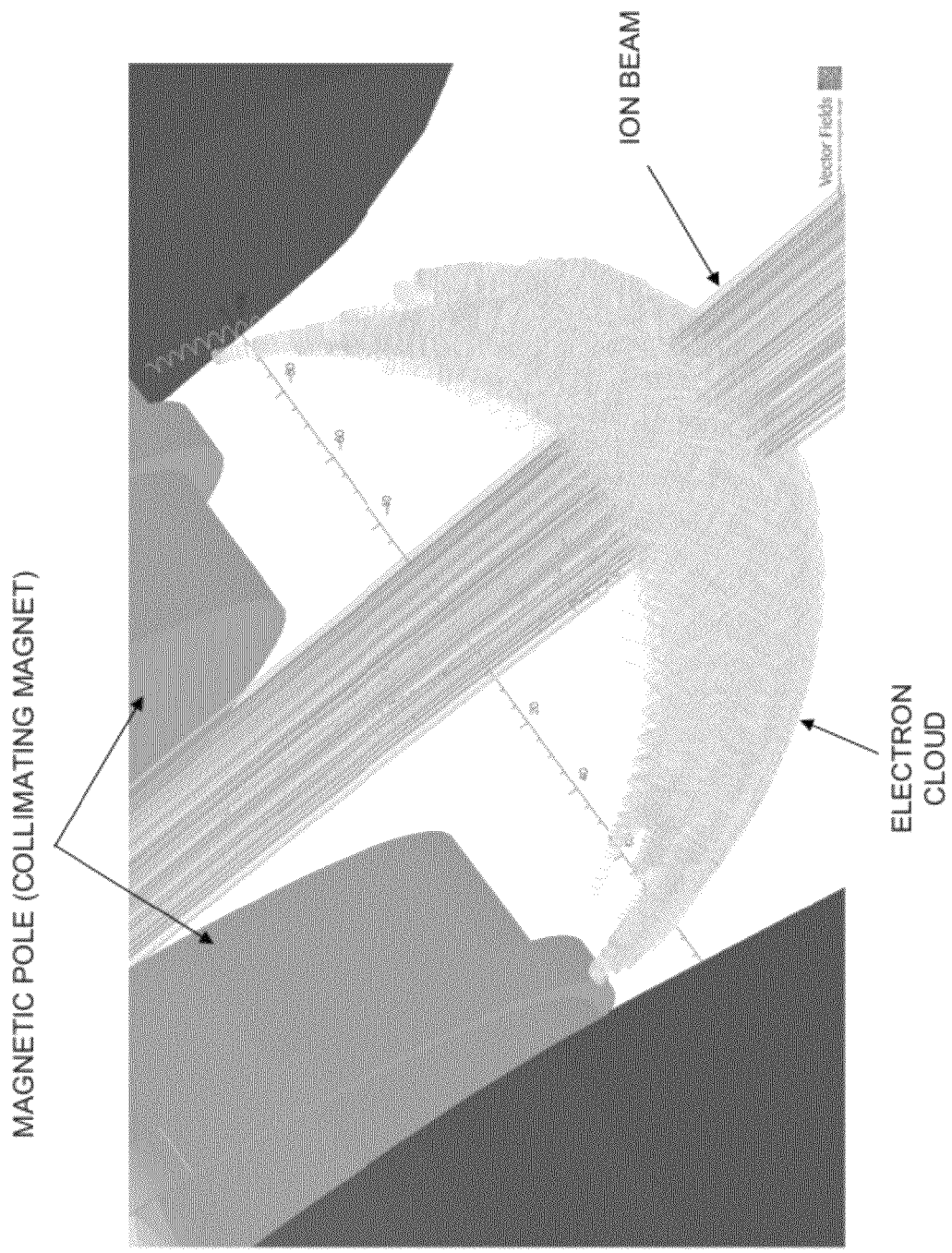
FIG. 10 is a diagram showing a simulation result representing an appearance of an electron cloud generated in a magnetic field gradient region of the collimator magnet and an ion beam passing through the electron cloud.
Figure 11:
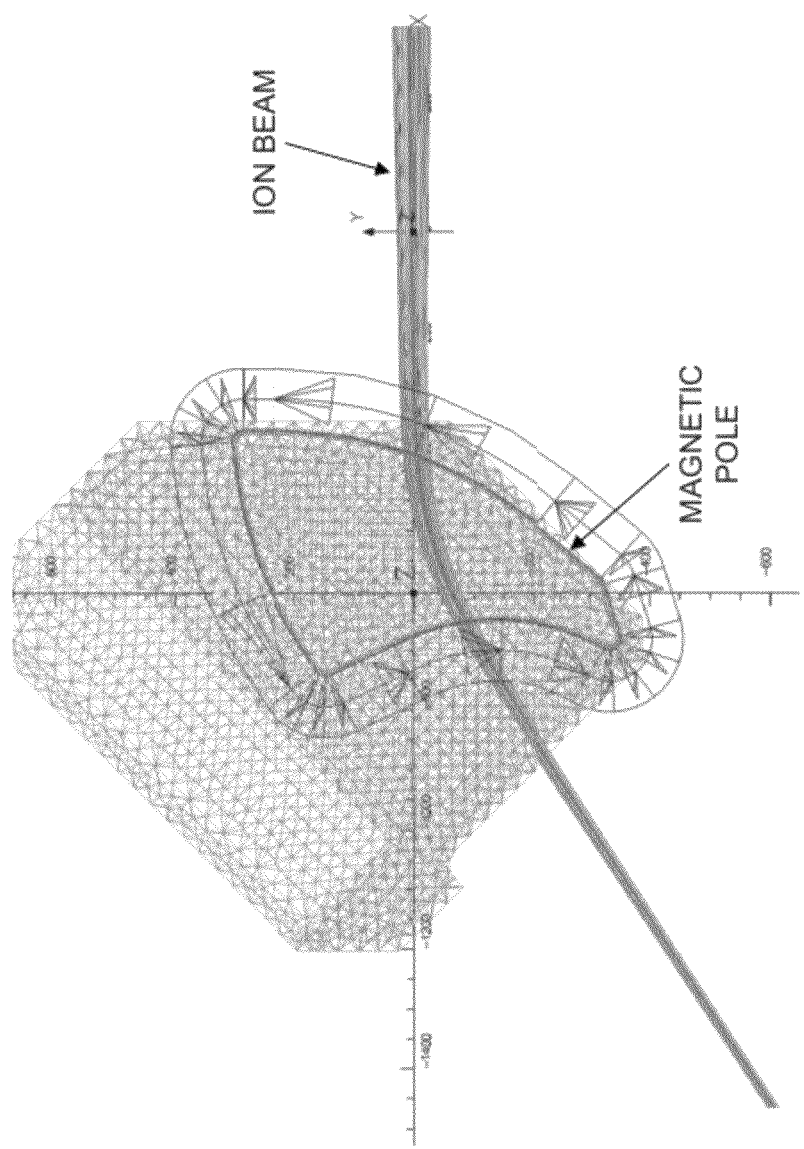
FIG. 11 is a diagram showing a simulation result representing an appearance of an ion beam when an electron cloud does not exist in the vicinity of the collimator magnet.
Figure 12:
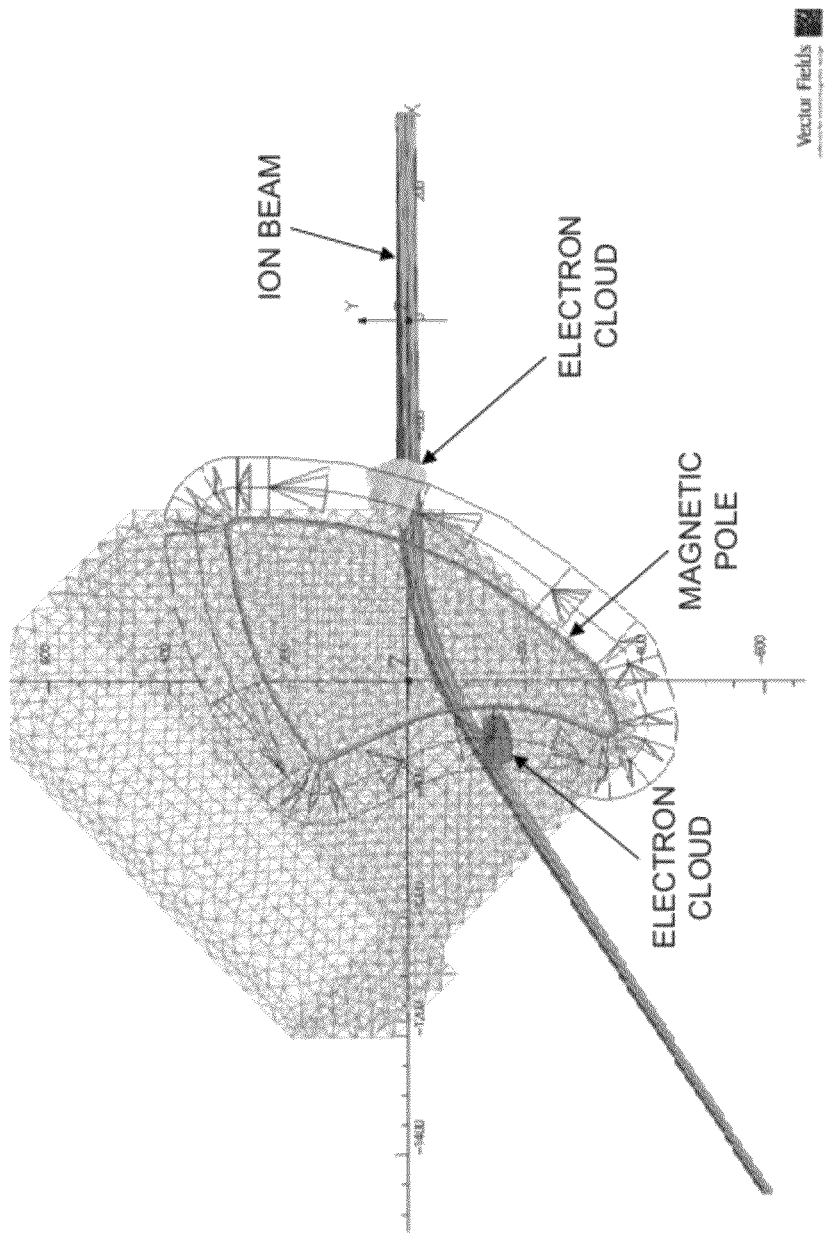
FIG. 12 is a diagram showing a simulation result representing an appearance of an ion beam when an electron cloud exists in the vicinity of the collimator magnet.
Figure 13:
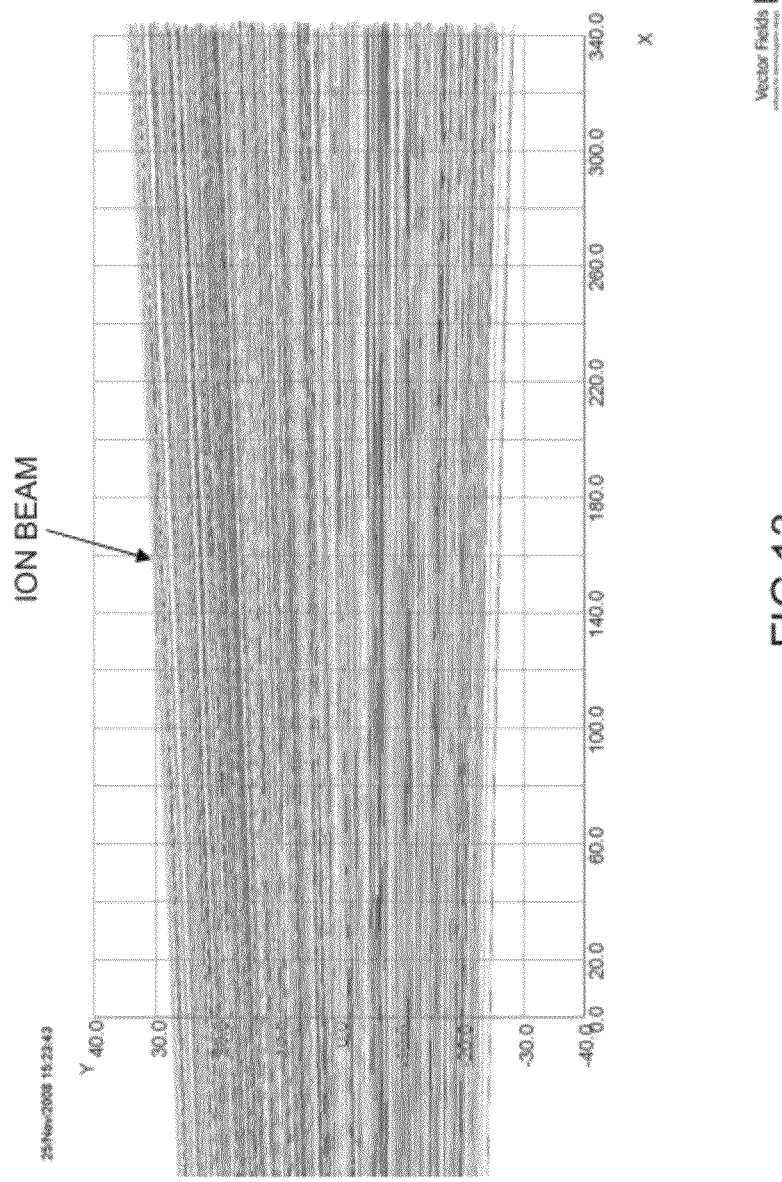
FIG. 13 is a diagram showing a simulation result representing an appearance of an ion beam in a target chamber when an electron cloud does not exist.
Figure 14:
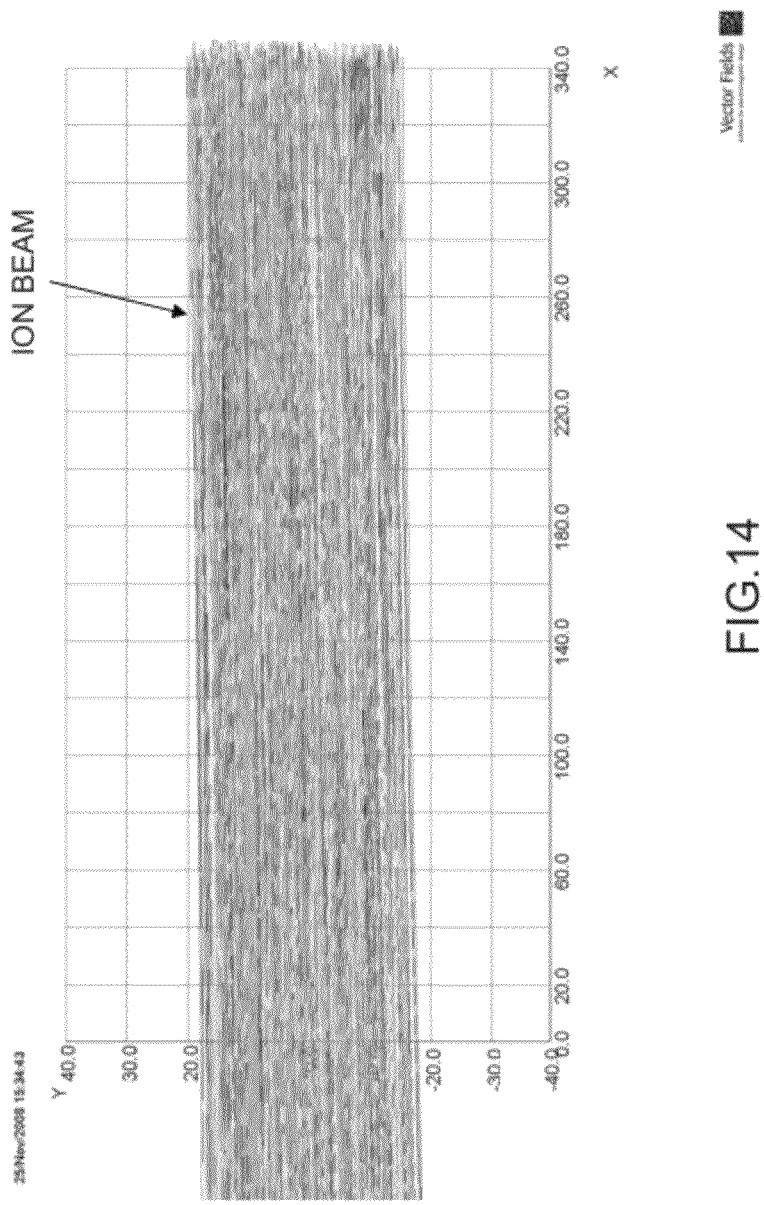
FIG. 14 is a diagram showing a simulation result representing an appearance of an ion beam in the target chamber when an electron cloud exists.

FIG. 10 is a simulation result representing an electron cloud produced in the magnetic field gradient region K in the vicinity of the collimating magnet 6 and an appearance of the ion beam IB passing through the electron cloud. Further, FIG. 11 is a simulation result showing an appearance of the ion beam IB in the case where there is no electron cloud in the vicinity of the collimating magnet 6, and FIG. 12 is a simulation result of the ion beam IB in the case where there is an electron cloud in the vicinity of the collimating magnet 6. Further, FIG. 13 is a simulation result showing an appearance of the ion beam IB in a target chamber in the case where there is no electron cloud, and FIG. 14 is a simulation result showing an appearance of the ion beam IB in the target chamber in the case where there is an electron cloud. In FIGS. 13 and 14, at the position of X coordinate being 0 is an inlet of the target chamber and at the position of 340 mm is a position where the target (wafer) W is located. As will be understood from these figures, the divergence of the ion beam IB is suppressed by forming an electron cloud in the vicinity of the collimating magnet 6.

Figure 15:
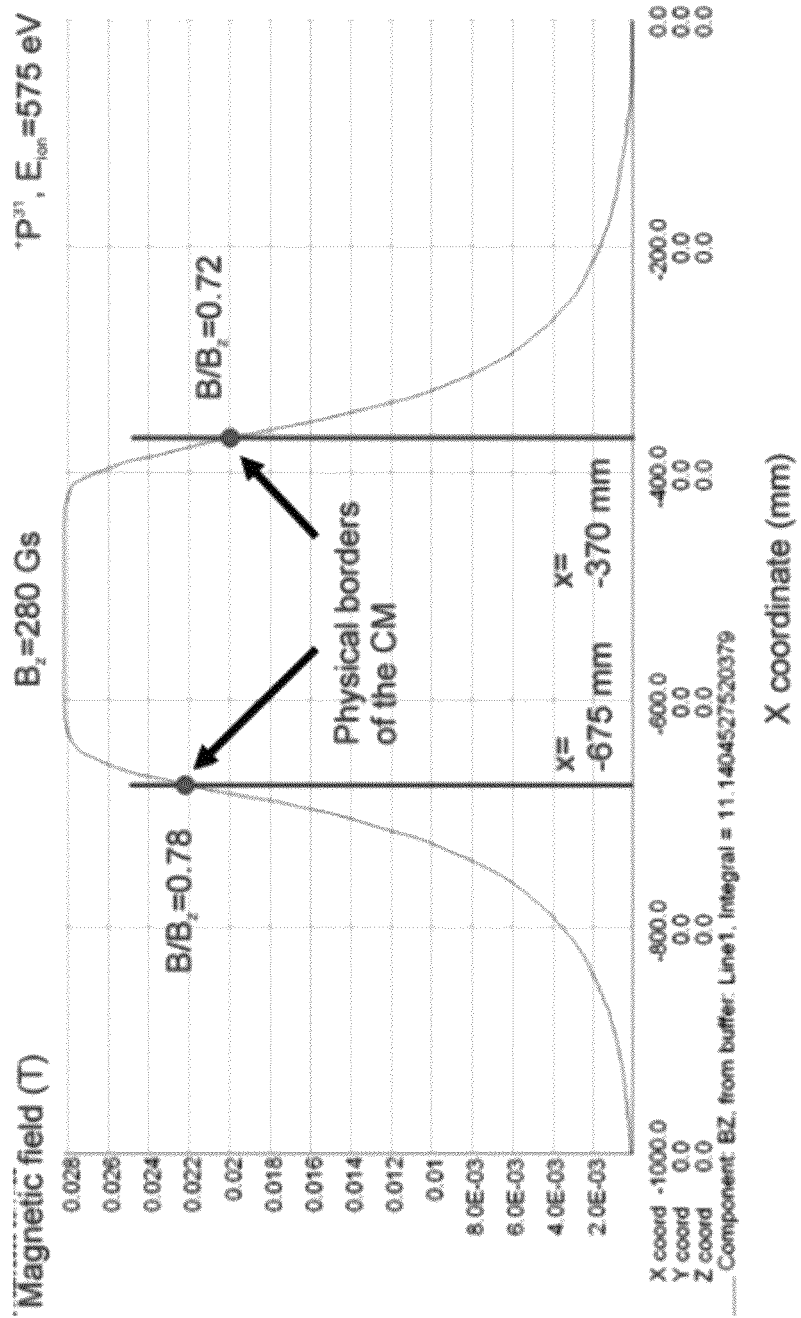
FIG. 15 is a diagram showing a magnetic field region of a collimator magnet for collimating $+P^{31}$ ions.

FIG. 15 is a diagram showing a magnetic field region in the collimating magnet 6 for collimating $+P^{31}$ ion having $E_{ion}$=575 eV. This collimating magnet 6 forms a constant magnetic field of 280 [Gs] ($=B_0$) between flat magnetic poles and a ratio of the magnetic fields B to $B_0$ on a physical boundary of the magnetic poles 6 of the collimating magnet 6 is $B/B_0$=0.72. Further, it is assumed that an ion current ($I_{ion}$) is 4 [μA], electron energy ($E_e$) is 10 [eV], and electron current ($I_e$) is 34×$I_{ion}$ [μA]. In FIG. 15, the simulation is performed assuming that a pair of magnetic pole surfaces 61a and 61b are parallel to the Z direction.

Figure 16:
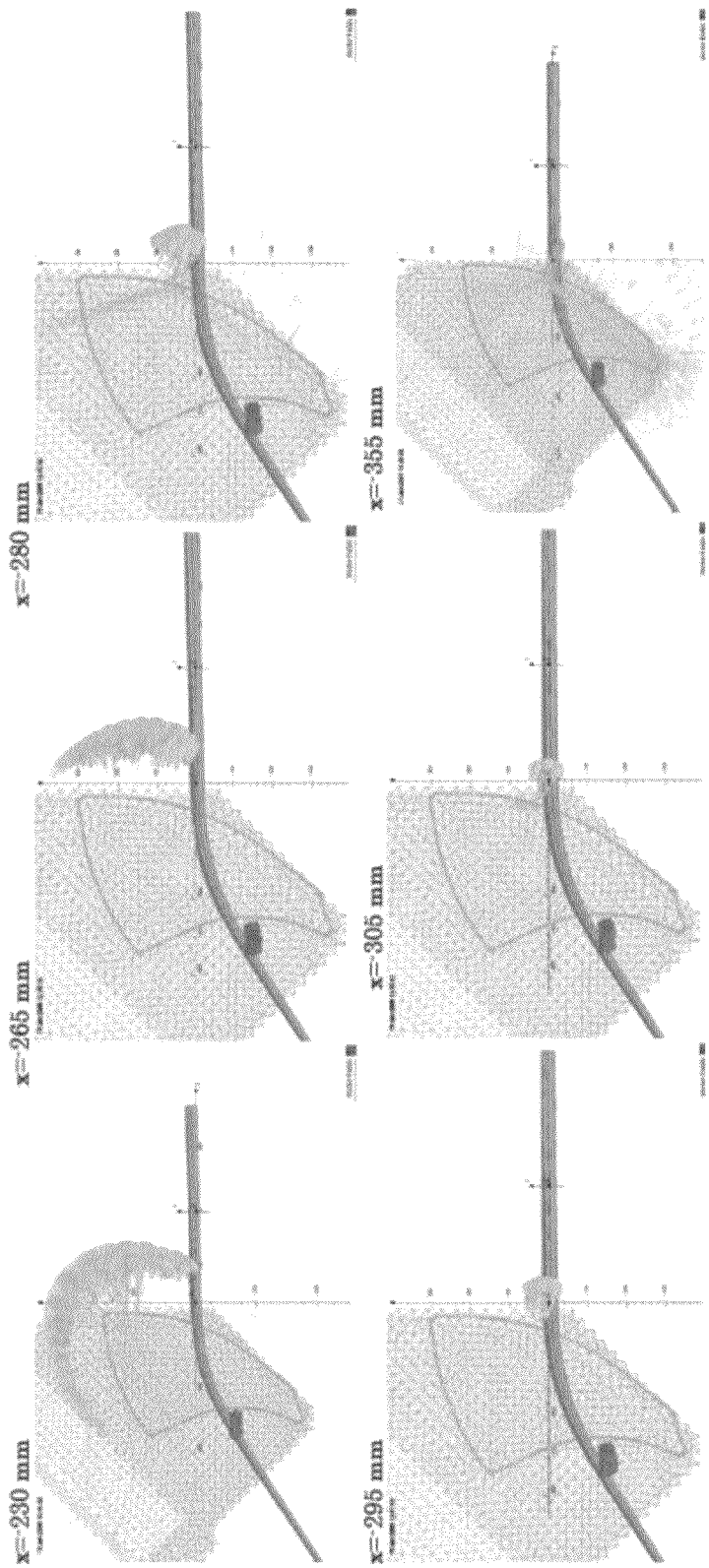
FIG. 16 is a diagram showing simulation results of confinement of electrons related to a distance between the collimator magnet and the electron source.
Figure 17:
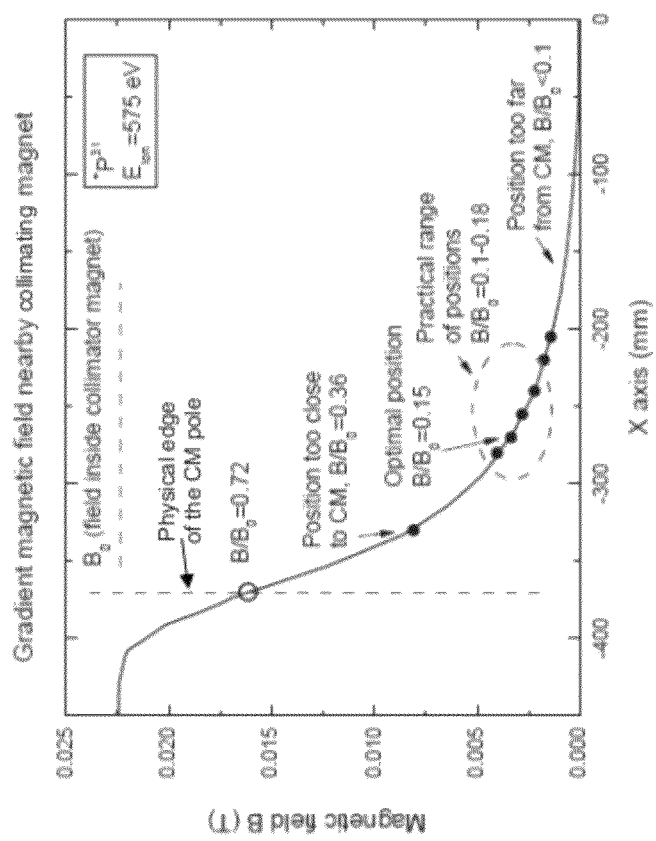
FIG. 17 is a diagram showing a simulation result representing a position of the collimator magnet and the electron source as a value of $B/B_0$.

If the electron sources 11 are brought too close to the collimating magnet 6, a mirror effect by the magnetic field gradient region K is weakened and the confining effect of the electrons becomes insufficient (see x=−355 mm, −305 mm in FIG. 16). If the electron sources 11 are located too far away from the magnet 6, although the confinement of the electrons due to a mirror effect can be performed, the region for confining the electrons becomes too wide and therefore the electrons cannot be efficiently supplied to the ion beam IB (see x=−230 mm in FIG. 16). Because of this, the electron sources 11 are located in the positions forming an electron confinement region where the confinement of the electrons due to the mirror effect is sufficient and sufficient electrons can be supplied to the ion beam IB (see x=−295 mm in FIG. 16). Considering $B/B_0$ in each of the positions mentioned above, in view of the result shown in FIG. 17, it was found that the positions for providing the electron sources 11 are desirably located in the magnetic field gradient region K satisfying the relationship of 0.12<$B/B_0$<0.36. Herein, the magnetic field distribution in FIG. 17 is shown along a center orbit of the ion beam IB in the advancing direction thereof.

Figure 18:
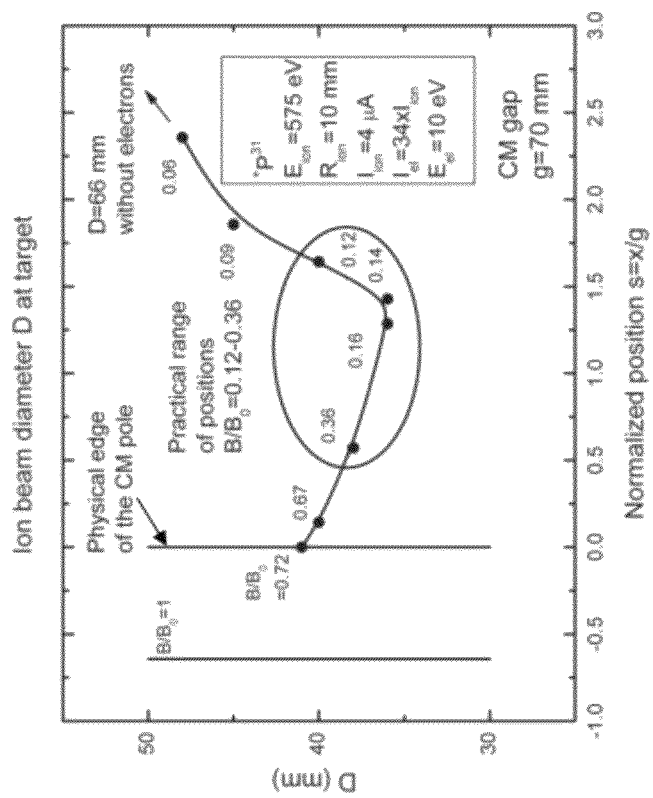
FIG. 18 is a diagram showing a relationship between a location of the electron source in the magnetic field gradient region of the collimator magnet and a diameter of the ion beam at a target position.

Herein, FIG. 18 shows a relationship between a location of the electron sources 11 in the magnetic field gradient region K of the collimating magnet 6 and a diameter D of the ion beam at a target position. In the case of arranging no electron source 11, an ion beam IB having a diameter D=66 mm is irradiated to the target W. Herein, the horizontal axis represents a normalized position obtained by dividing the position by an inter-pole gap of the collimating magnet 6. As understood from this figure, the diameter D of the ion beam IB becomes the minimum value in a magnetic field gradient region K satisfying the relationship of 0.12<$B/B_0$<0.36.

Next, the following describes an arrangement aspect in specific in the case where the electron sources 11 are provided in the vicinity of the upstream side (inlet) and in the vicinity of the downstream side (outlet) of the ion beam IB with respect to the compensating magnet 7.

Assuming that the maximum value of the magnetic flux density generated between a pair of parallel magnetic pole surfaces 71a and 71b constituting the compensating magnet 7 is $B_0$ and the magnetic flux density in the magnetic field gradient region K formed outside the compensating magnet 7 is B, the electron sources 11 are provided in the magnetic field gradient region K satisfying a relationship of 0<$B/B_0$<1. More specifically, the electron sources 11 are provided in the magnetic field gradient region K satisfying a relationship of 0.30<$B/B_0$<0.80.

Herein, the positions of the electron sources 11 with respect to the compensating magnet 7 and a confining action of electrons at this time are described based on the simulation results.

Figure 19:
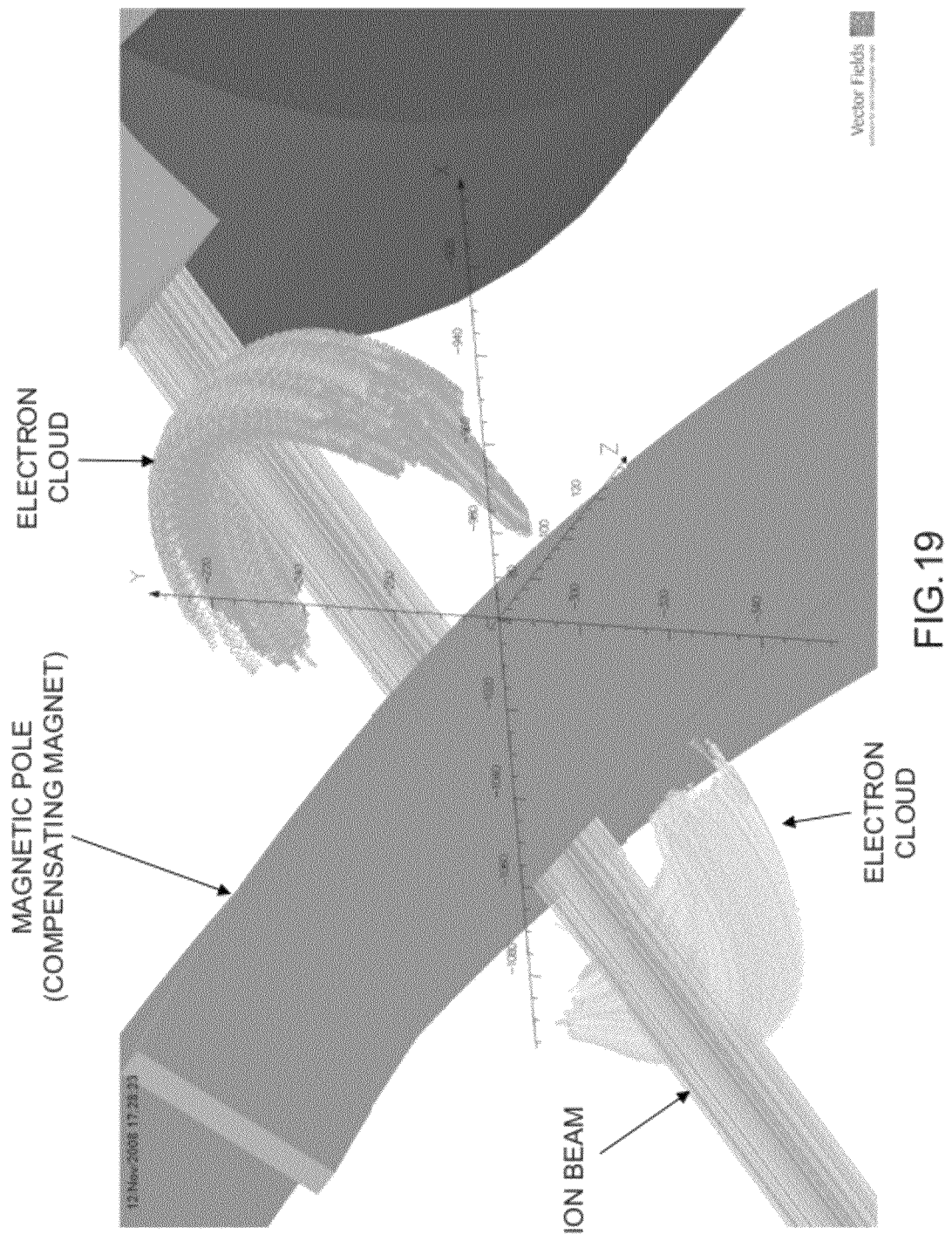
FIG. 19 is a diagram showing a simulation result representing an appearance of an electron cloud generated in a magnetic field gradient region of the compensation magnet and an ion beam passing through the electron cloud.
Figure 20:
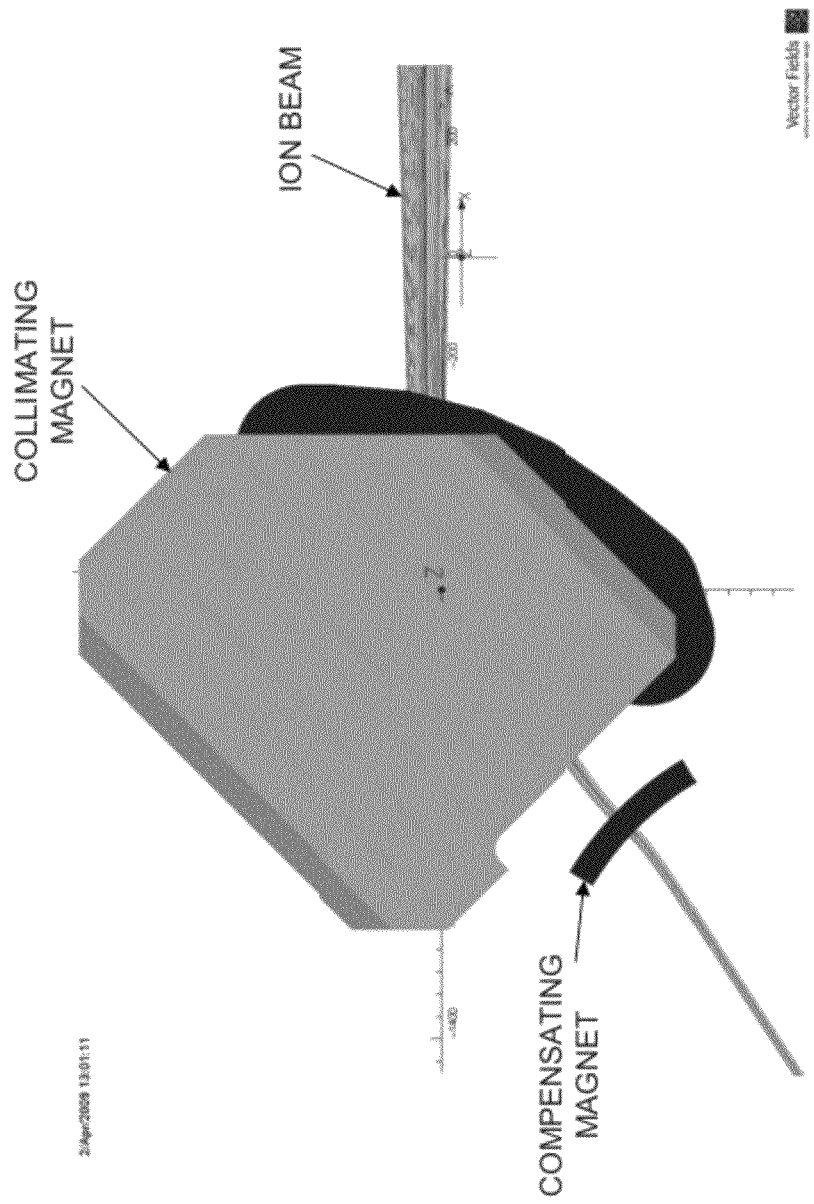
FIG. 20 is a diagram showing a simulation result representing an appearance of an ion beam when an electron cloud does not exist in the vicinity of the compensation magnet.
Figure 21:
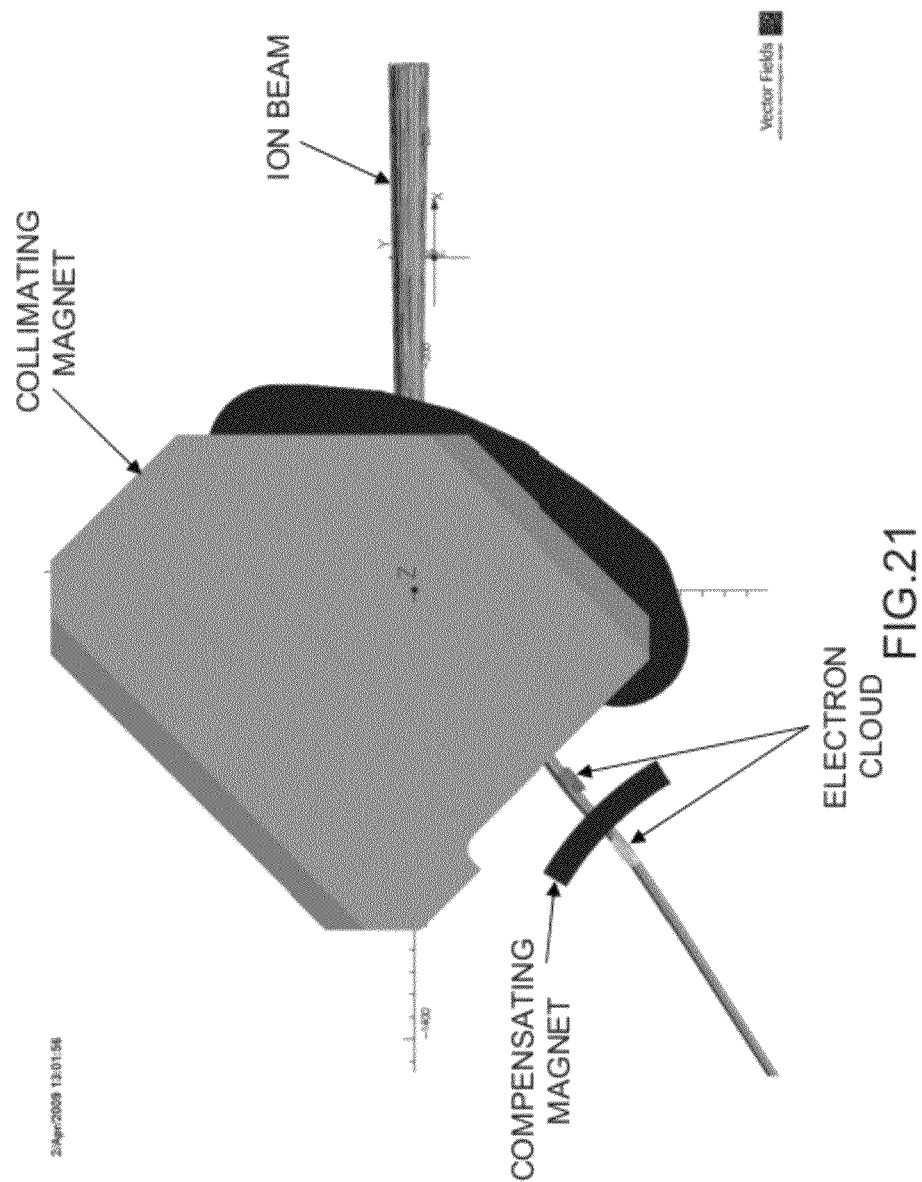
FIG. 21 is a diagram showing a simulation result representing an appearance of an ion beam when an electron cloud exists in the vicinity of the compensation magnet.
Figure 22:
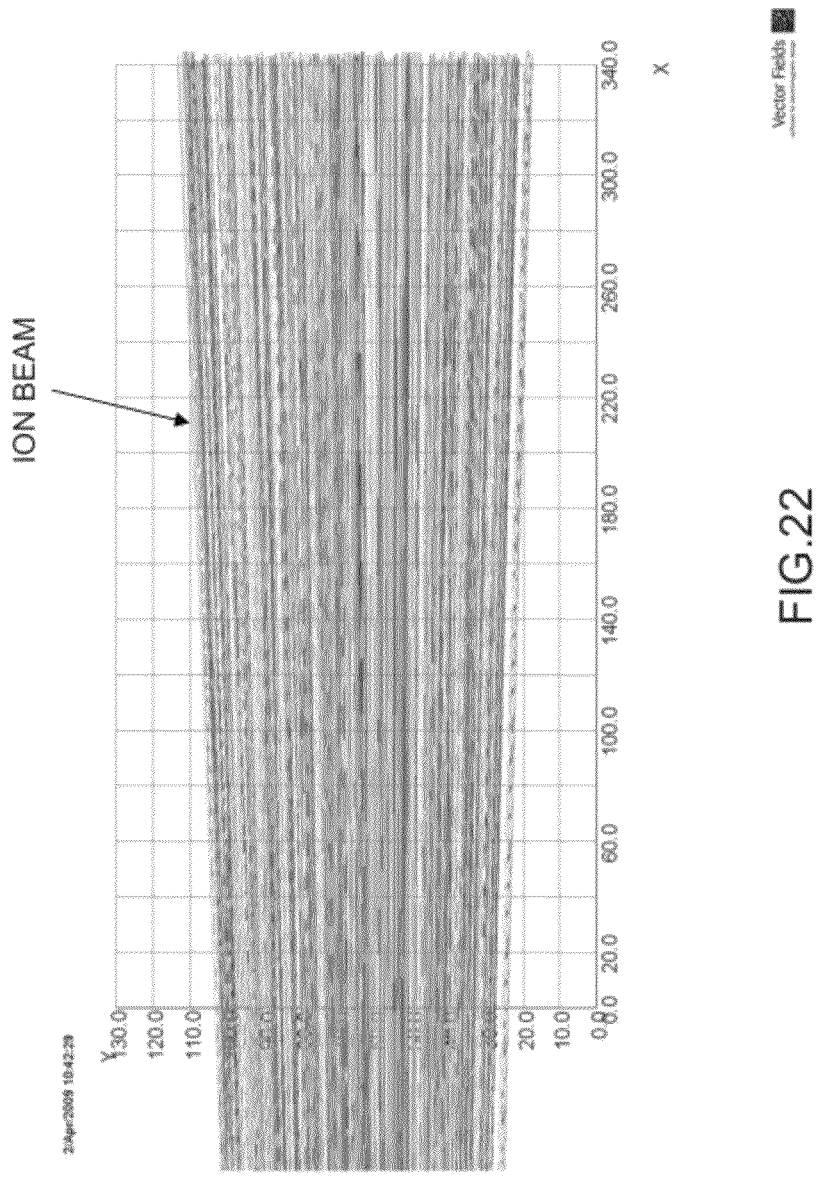
FIG. 22 is a diagram showing a simulation result representing an appearance of an ion beam in a target chamber when an electron cloud does not exist.
Figure 23:
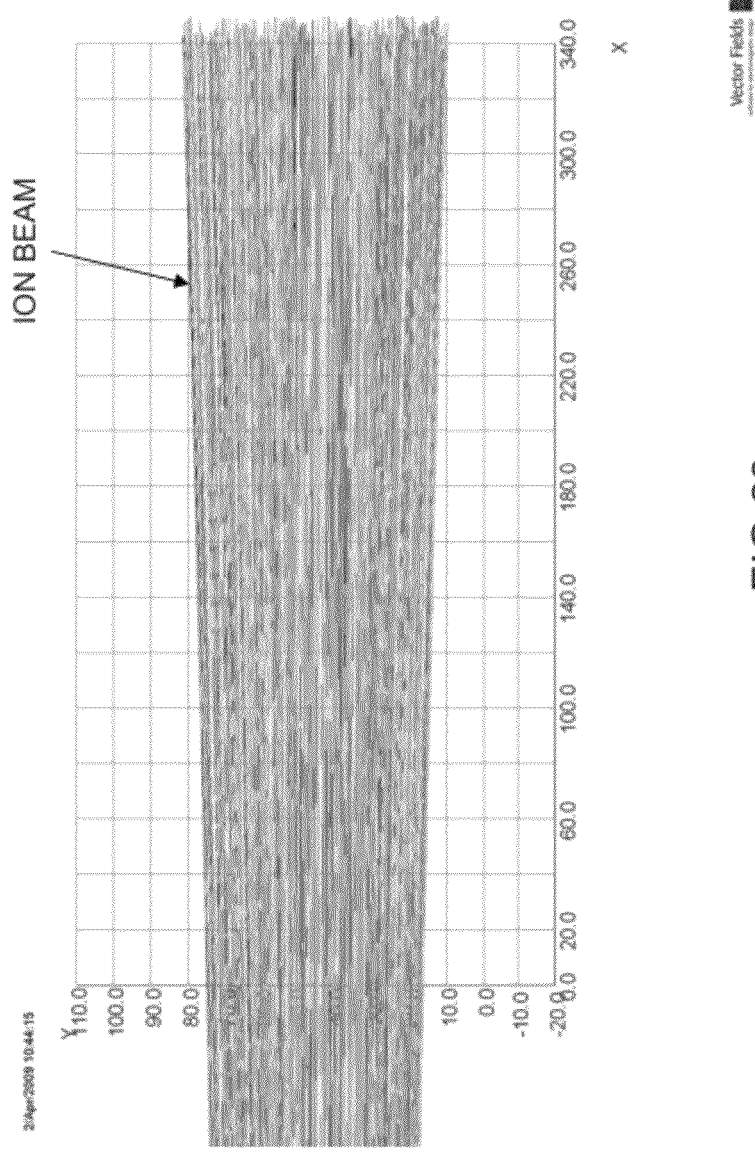
FIG. 23 is a diagram showing a simulation result representing an appearance of an ion beam in the target chamber when an electron cloud exists.

FIG. 19 is a simulation result representing an electron cloud produced in the magnetic field gradient region K in the vicinity of the compensating magnet 7 and an appearance of the ion beam IB passing through the electron cloud. Further, FIG. 20 is a simulation result showing an appearance of the ion beam IB in the case where there is no electron cloud in the vicinity of the compensating magnet 7, and FIG. 21 is a simulation result of the ion beam IB in the case where there is an electron cloud in the vicinity of the compensating magnet 7. Further, FIG. 22 is a simulation result showing an appearance of the ion beam IB in the target chamber in the case where there is no electron cloud, and FIG. 23 is a simulation result showing an appearance of the ion beam IB in the target chamber in the case where there is an electron cloud. In FIGS. 22 and 23, the position of X coordinate at 0 is an inlet of the target chamber and the position at 340 mm is a position where the target (wafer) W is located. As understood from these figures, it is understood that the divergence of the ion beam IB is suppressed by forming an electron cloud in the vicinity of the compensating magnet 7.

Figure 24:
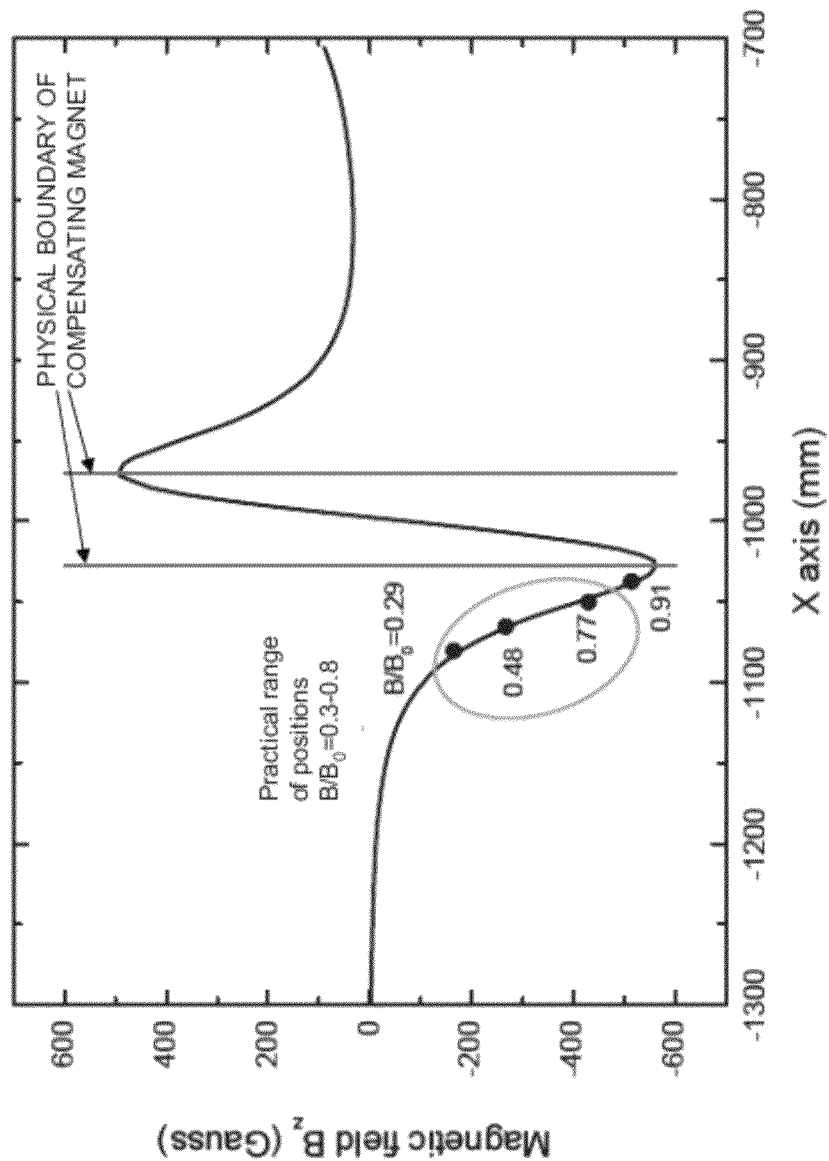
FIG. 24 is a diagram showing a distribution of a magnetic field of a compensation magnet for compensating $+P^{31}$ ions.

FIG. 24 is a diagram showing a magnetic field region in the compensating magnet 7 for compensating $+P^{31}$ ion having $E_{ion}$=575 eV. Herein, the magnetic field distribution in FIG. 24 is shown along a center orbit of the ion beam IB in the advancing direction thereof. This compensating magnet 7 forms a constant magnetic field of 280 [Gs] ($=B_0$) between the flat magnetic poles, and a ratio of the magnetic fields B to $B_0$ on a physical boundary of the magnetic poles of the compensating magnet 7 is $B/B_0$=1.0. Further, it is assumed that an ion current ($I_{ion}$) is 4 [μA], electron energy ($E_e$) is 10 [eV], and electron current ($I_e$) is 34×$I_{ion}$ [μA].

At this time, although not shown in the figure, as a result of performing the simulation as to the positions of the electron sources 11 with respect to the compensating magnet 7 and a confining action of electrons at that time, it was found that the positions for providing the electron sources 11 are desirably located in a magnetic field gradient region K satisfying the relationship of 0.30<$B/B_0$<0.80 as shown in FIG. 24.

Figure 25:
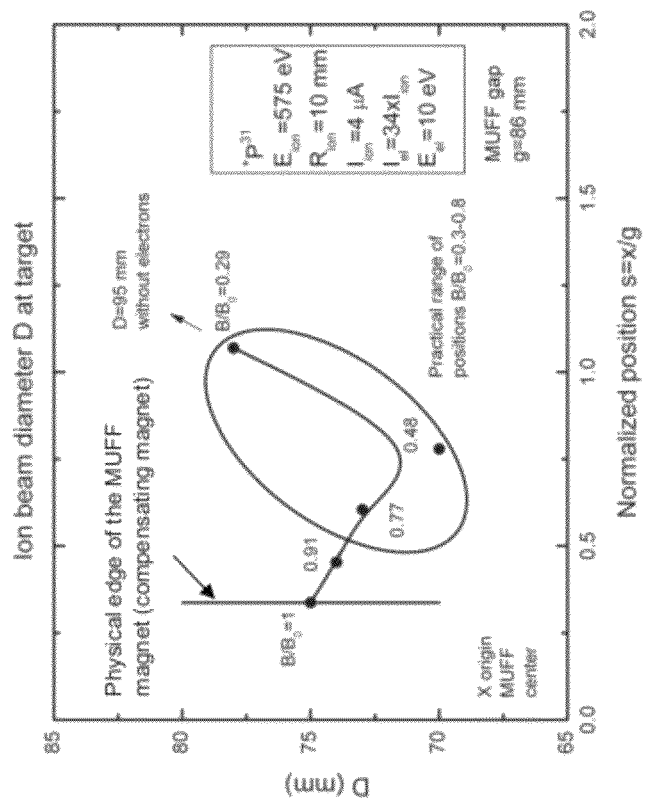
FIG. 25 is a diagram showing a relationship between a location of the electron source in the magnetic field gradient region of the compensation magnet and a diameter of the ion beam at a target position.

Herein, FIG. 25 shows a relationship between a location of the electron sources 11 in the magnetic field gradient region K of the compensating magnet 7 and a diameter D of the ion beam IB at a target position. In the case of arranging no electron source 11, an ion beam IB having a diameter D=95 mm is irradiated to the target W. Herein, the horizontal axis represents a normalized position obtained by dividing the position by an inter-pole gap of the compensating magnet 7. As understood from this figure, it was found that the diameter D of the ion beam IB becomes the minimum value in a magnetic field gradient region K satisfying the relationship of 0.30<$B/B_0$<0.80.

Figure 26:
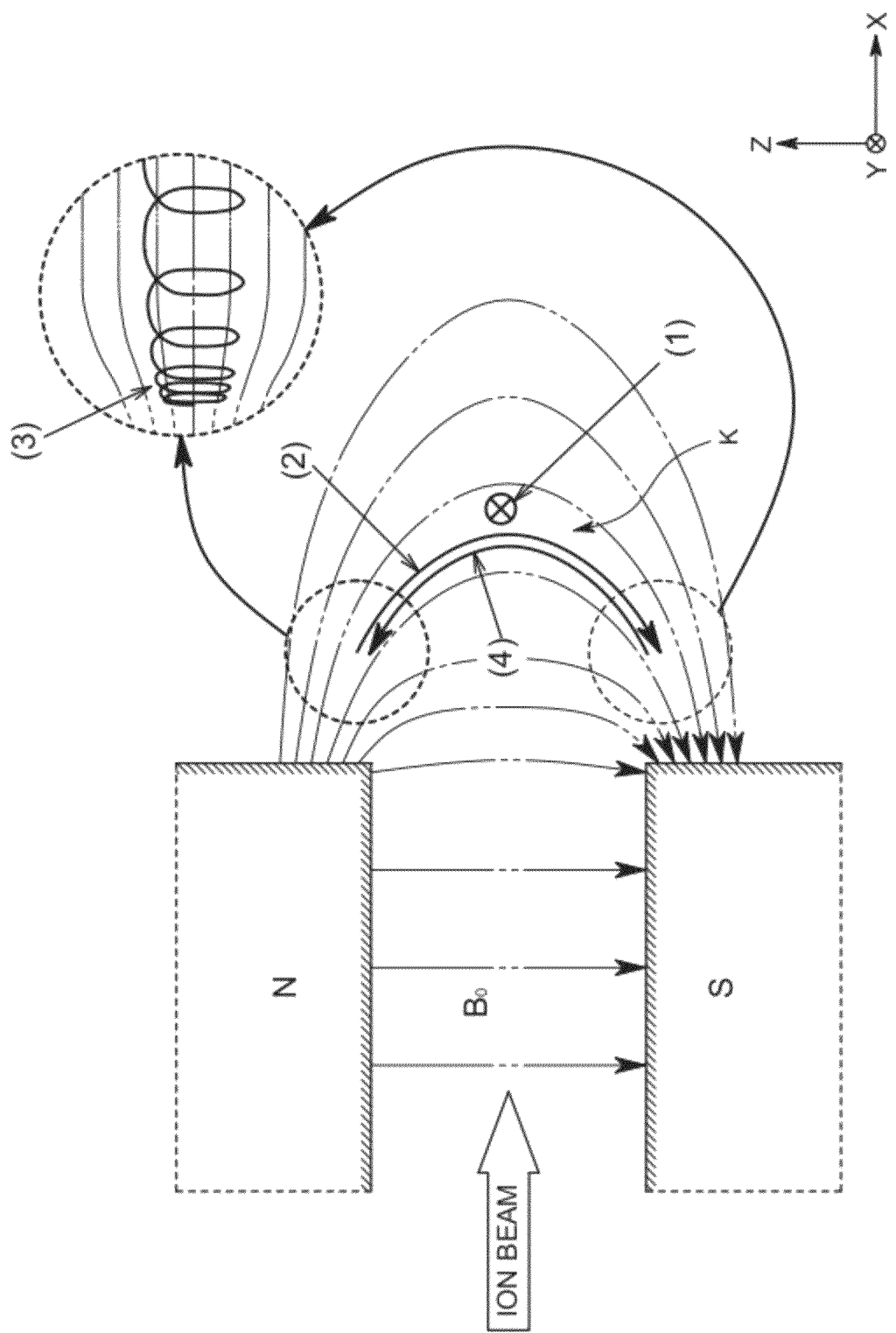
FIG. 26 is a diagram schematically showing an electron movement within a magnetic field gradient region formed in the vicinity of the collimator magnet.

Next, the following describes a movement of electrons in the magnetic field gradient region K formed in the vicinity of the collimating magnet 6 with reference to FIG. 26. Although a movement regarding the compensating magnet 7 is not described, it is similar to the movement in the magnetic field gradient region K of the collimating magnet 6.

Figure 27:
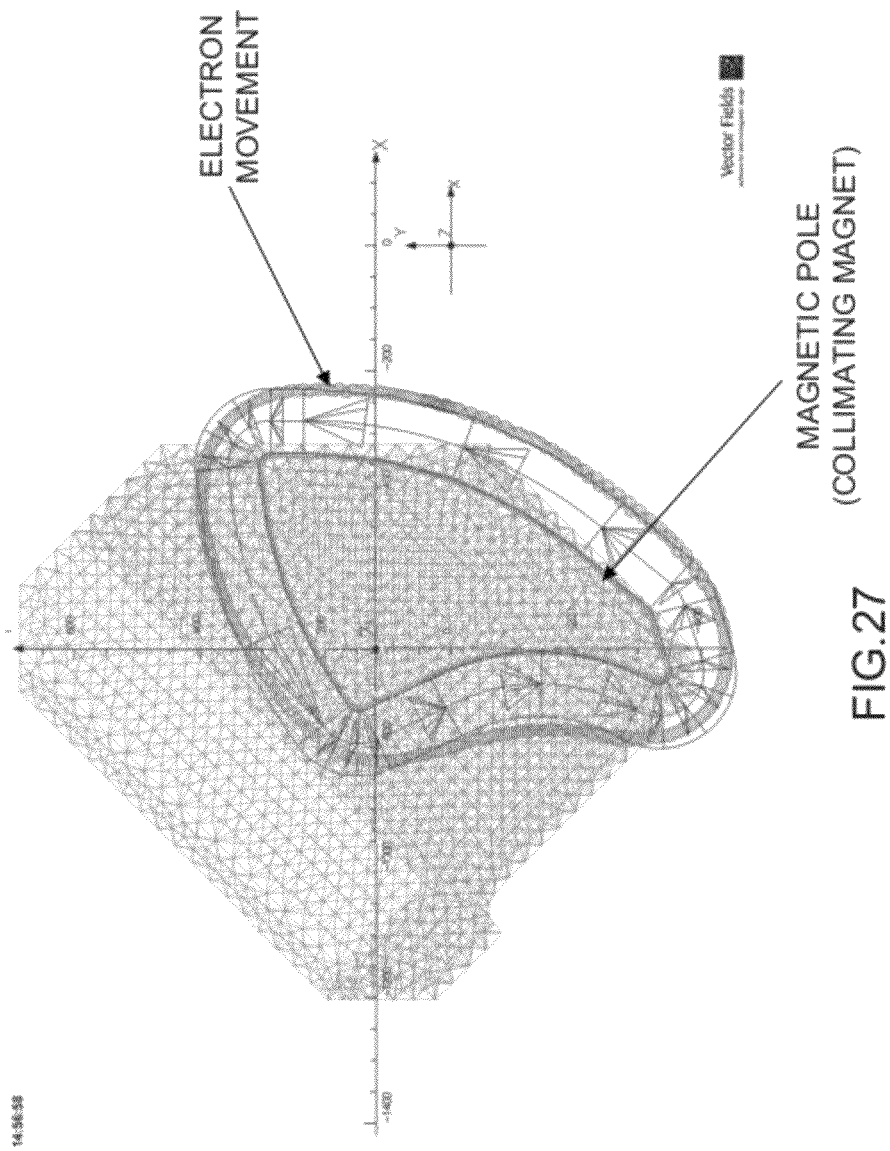
FIG. 27 is a diagram showing a simulation result of an electron movement along a magnetic field having a constant intensity in the vicinity of the collimator magnet.
Figure 28:
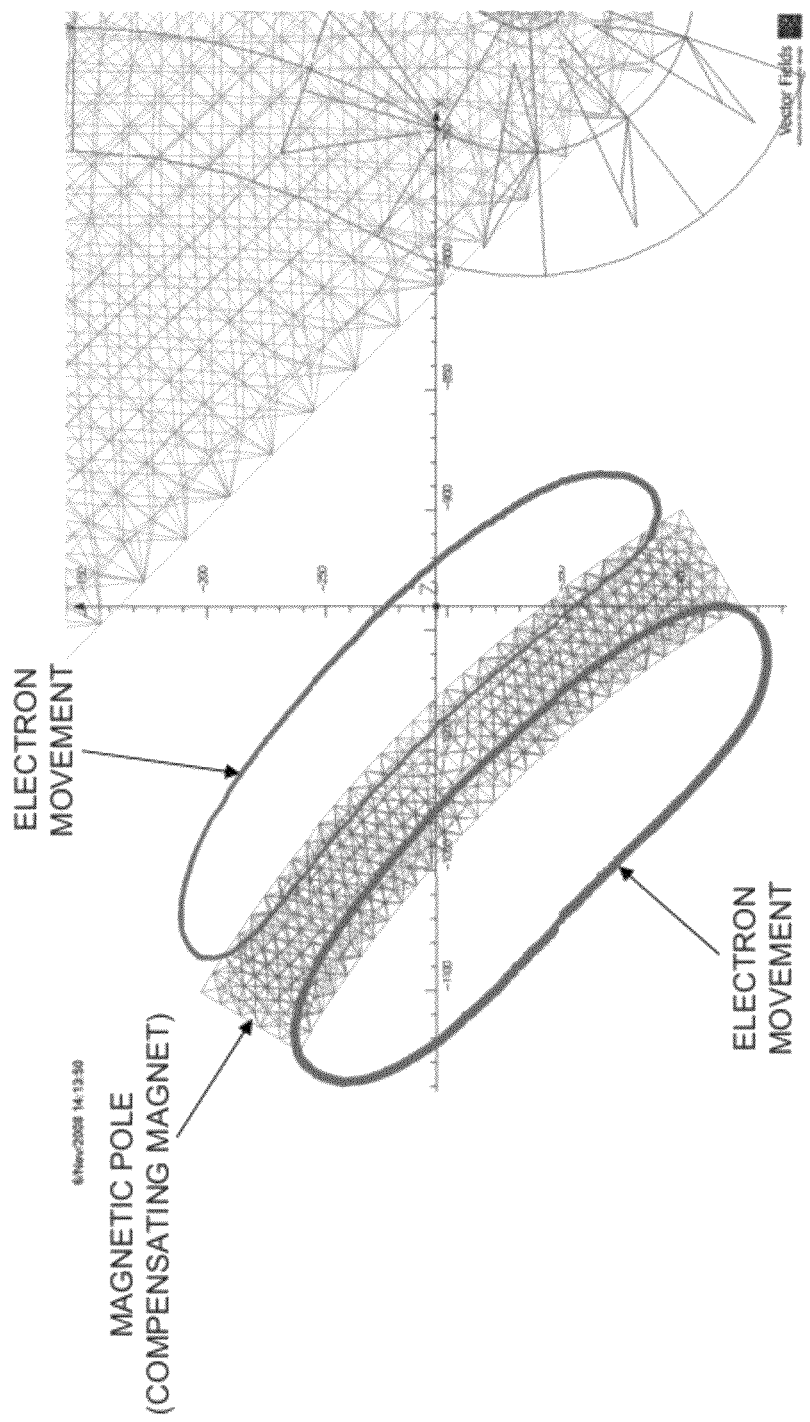
FIG. 28 is a diagram showing a simulation result of an electron movement along a magnetic field having a constant intensity in the vicinity of the compensation magnet.

Considering the circumferential direction (a direction along the XY plane) of the collimating magnet 6 in the magnetic field gradient region K, since a magnetic field of a constant intensity is formed, the electrons are moved along the magnetic field having this constant intensity (arrow mark (1) shown in FIG. 26). The simulation of the electron movement at this time is shown in FIG. 27. FIG. 28 is a simulation result representing an appearance of the electron movement in the case where the electrons are irradiated to the magnetic field gradient region K formed in the vicinity of the compensating magnet 7.

Figure 29:
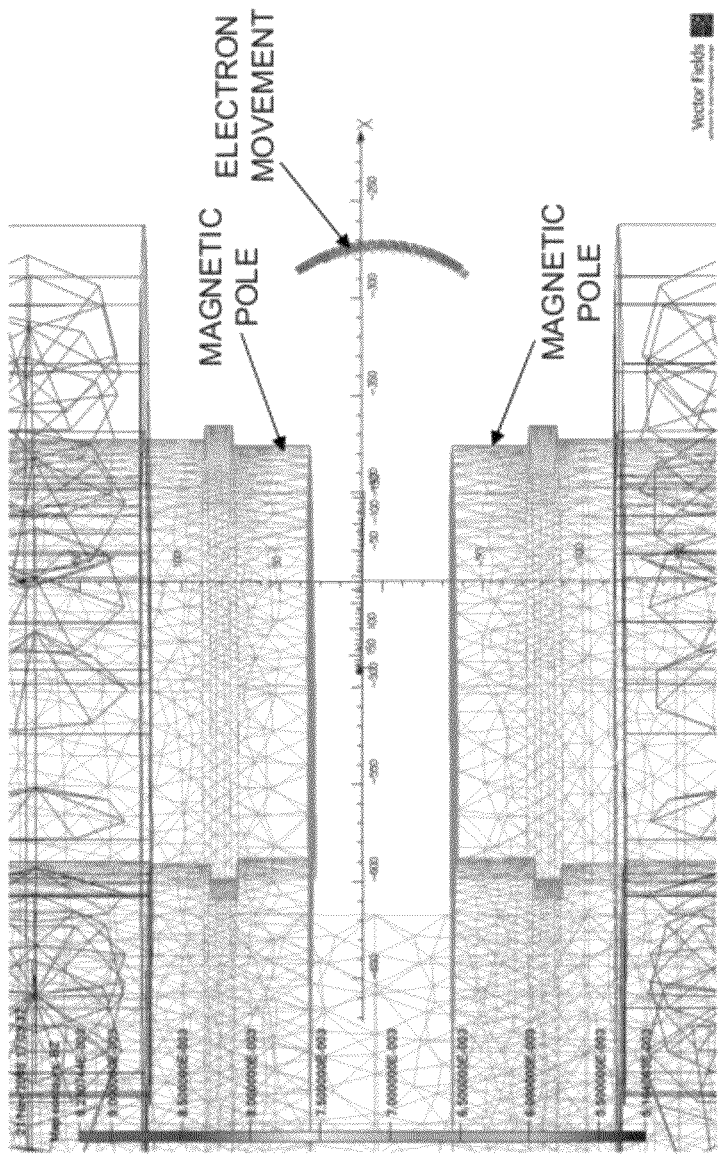
FIG. 29 is a diagram showing a simulation result of an electron movement along a direction of a magnetic field.
Figure 30:
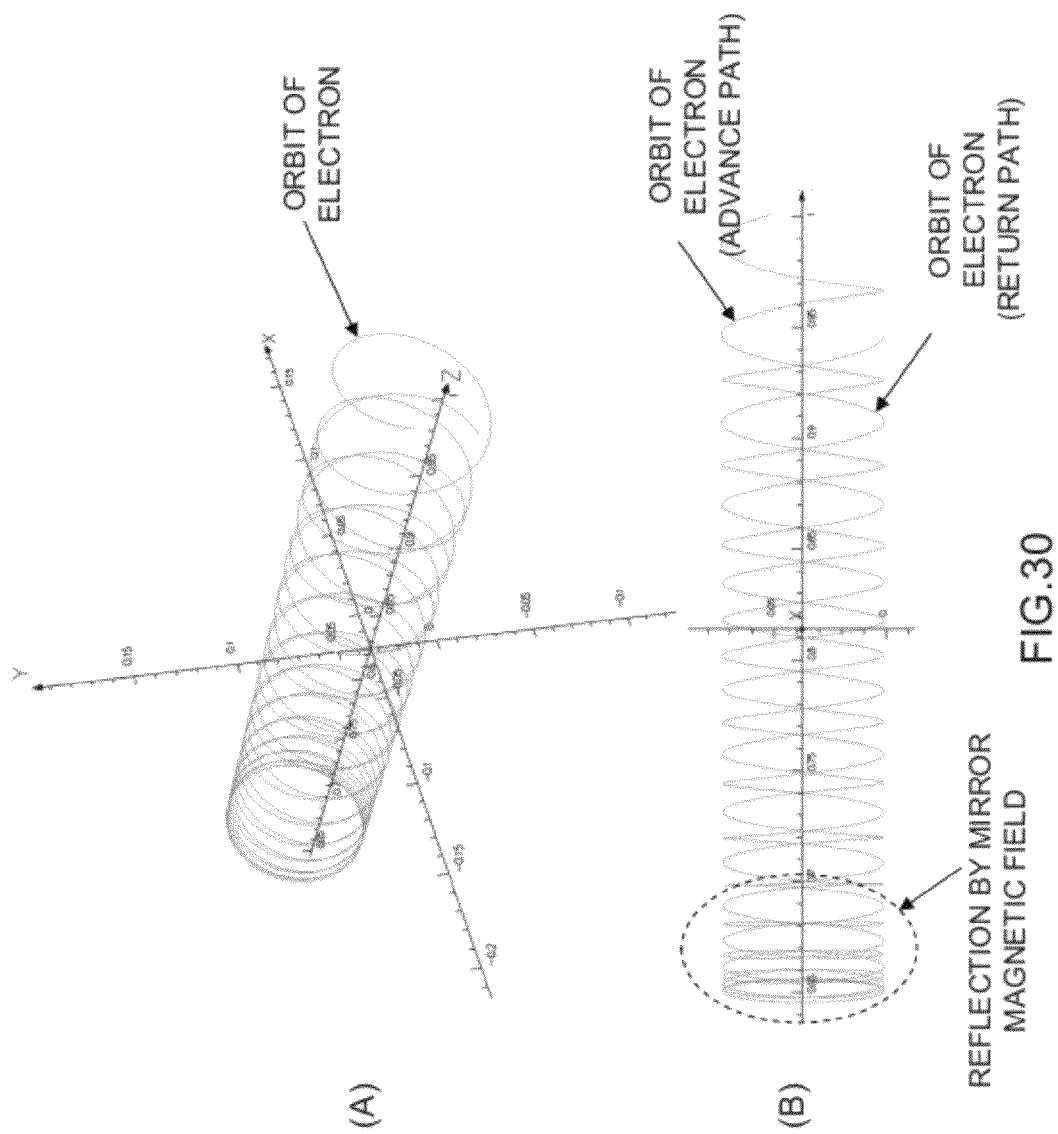
FIG. 30 is a diagram showing a simulation result of an electron movement within the magnetic field gradient region of the collimator magnet.

Meanwhile, considering the Z direction, the electrons are moved along the magnetic field (shown by an arrow mark (2) in FIG. 26). The simulation of the electron movement at this time is shown in FIG. 29. Then, the electrons moved in the Z direction are reflected in a direction reverse to the direction of the electron flight orbit up to now by a mirror effect (shown by (3) and (4) in FIG. 26). FIGS. 30 (A) and (B) show simulation results of electron reciprocation by the mirror effect. FIG. 30 (A) is a simulation result showing a three-dimensional electron orbit in a mirror magnetic field, and FIG. 30 (B) is a simulation result showing a two-dimensional electron orbit in the mirror magnetic field.

Figure 31:
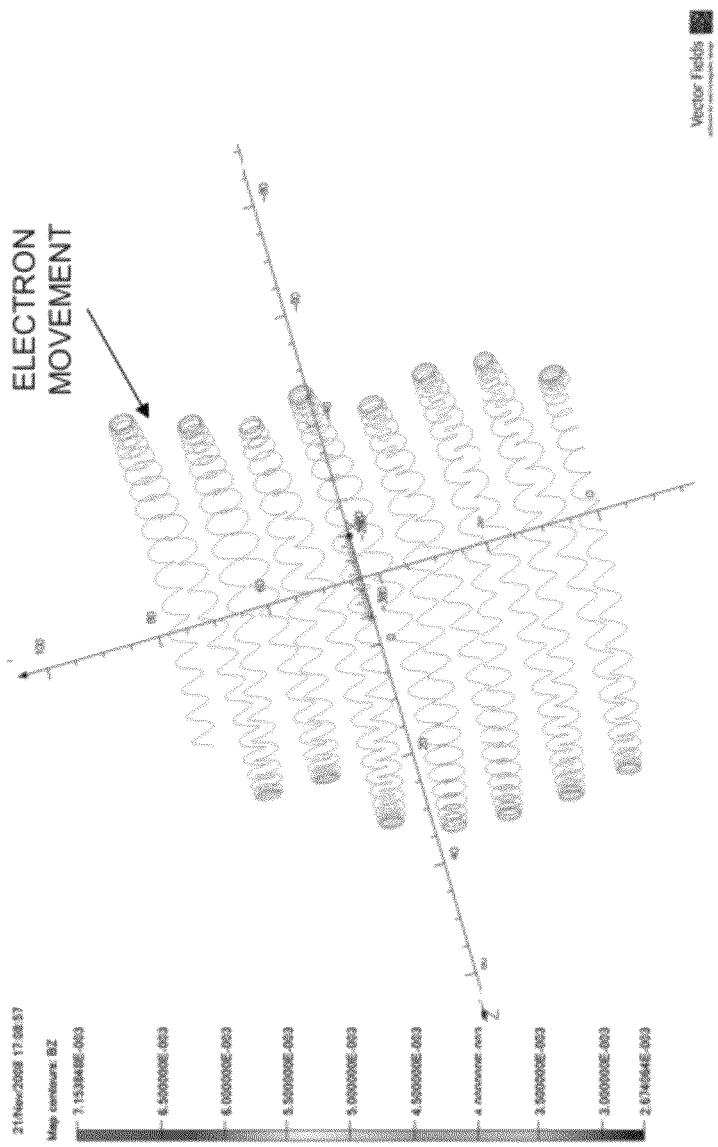
FIG. 31 is a diagram showing a simulation result of an electron movement within the magnetic field gradient region of the collimator magnet.

That is, as the orbit of the electrons, the electrons conduct a movement around the magnet by the magnetic field gradient, a movement along the magnetic field direction with a helical movement while rotating around the magnetic lines of force in the magnetic field gradient region K and a movement combined with a reflection movement by the mirror effect in the vicinity of the magnetic poles. That is, the electrons move between the magnetic pole surfaces in a zigzag manner with a helical movement as shown in FIG. 31. Thus, an electron cloud is formed in a region which the ion beam IB passes through so that the electrons are efficiently supplied to the ion beam IB.

Effect of the Present Embodiment

According to the ion beam irradiation device 100 pertaining to the present embodiment configured as described above, since the electron sources are arranged in the magnetic field gradient region K formed by the collimating magnet 6 and the compensating magnet 7 and arranged outside the passing region of the ion beam IB so that the electrons are supplied into the magnetic field gradient region K, the supplied electrons can be confined within the magnetic field gradient region K by the mirror effect of the magnetic field gradient. As a result of this, electron clouds can be formed on the ion beam downstream side of the collimating magnet 6 and on the ion beam upstream side and ion beam downstream side of the compensating magnet 7 so that the divergence of the ion beam can be suppressed by a space charge effect. Moreover, since the electron sources 11 are provided in the vicinity of the magnets 6 and 7, by effectively utilizing a space in the vicinity of the magnets that was conventionally restricting the arrangement of parts, the need for a special magnetic pole structure can be eliminated.

Other Modified Embodiments

It is noted that the present invention is not limited to the embodiment mentioned above.

For example, in the embodiment, although an aspect of providing the electron sources in the vicinity of the beam collimator and in the vicinity of the compensator is described, the electron sources may be provided in the vicinity of the other magnets such as, e.g., a mass separator, an energy separator or a scanner located between the ion source and the target. Moreover, it may be also considered that the ion beam irradiation device may not only be provided with the electron sources in the vicinity of the existing magnets but also may be provided with additional magnets, and may be provided with electron sources in the vicinity of those additional magnets.

Further, in the embodiment, although the electron sources are provided on the ion beam downstream side (outlet) of the collimating magnet, if the electron sources are further provided on the ion beam upstream side (inlet), the ion beam can be further neutralized. In such a compensating magnet, the electron sources may be provided in one of the upstream side or the downstream side.

Further, in the embodiment, although each of the collimating magnets and the compensating magnet include an electromagnet, these may include permanent magnets.

In addition, the compensating magnet may be provided on the downstream side of the collimating magnet.

Furthermore, although an electron energy of 10 eV is used as the electron energy in the simulation of the embodiment, it is not limited to this, and since electrons of low energy are effective for neutralizing the ion beam, it may be also considered to use electrons having an energy of, e.g., 5 to 25 eV.

In addition, it is needless to say that the present invention is not limited to the above embodiments and various changes and modifications may be made within a range unless deviated from the essence thereof.

INDUSTRIAL APPLICABILITY

According to the present invention, by effectively utilizing a space in the vicinity of the magnets, the utilization efficiency of electrons can be improved so that the spread of the ion beam can be efficiently suppressed by a space charge effect while eliminating the need for a special magnetic pole structure.

The invention claimed is:

1. An ion beam irradiation device irradiating an ion beam to a target comprising:
    an ion source producing an ion beam including positive ions;
    one or more magnets provided between the ion source and the target for deflecting, converging or diverging the ion beam generated from the ion source to be irradiated to the target; and
    one or more electron sources producing electrons, wherein the one or more electron sources are located in a magnetic field gradient region formed on an ion beam upstream side and/or ion beam downstream side of the magnets and located outside a region passed by the ion beam, the magnetic field gradient region is formed within the range of a normalized position from 0 to 2, the normalized position is calculated by dividing a distance from the one or more magnets by an inter-pole gap of the magnets, and wherein
    an electron emitting direction of each of the one or more electron sources is oriented to supply the electrons to the magnetic field gradient region.

2. The ion beam irradiation device according to claim 1, wherein each of the magnets include a pair of parallel magnetic pole surfaces provided in a manner that sandwiches the ion beam, and wherein
    the electron emitting direction of each of the one or more electron sources is oriented to be substantially perpendicular to the magnetic pole surfaces so as to be directed to a magnetic pole surface opposed to the magnetic pole surfaces or directed to be outward of the magnets.

3. The ion beam irradiation device according to claim 2, wherein the electron emitting direction of each of the one or more electron sources is a tangential direction of a magnetic field in the magnetic field gradient region.

4. The ion beam irradiation device according to claim 1, wherein the magnets include a collimating magnet substantially collimating the ion beam by a pair of parallel magnetic pole surfaces, wherein
the one or more electron sources are provided in the magnetic field gradient region formed by the collimating magnet, and wherein
assuming that a magnetic flux density generated between the magnetic pole surfaces of the collimating magnet is $B_0$ and a magnetic flux density in the magnetic field gradient region formed outside the collimating magnet is B, the one or more electron sources are provided in the magnetic field gradient region satisfying a relationship of $0 < B/B_0 < 0.72$.

5. The ion beam irradiation device according to claim 4, wherein the one or more electron sources are provided in the magnetic field gradient region satisfying a relationship of $0.12 < B/B_0 < 0.36$.

6. The ion beam irradiation device according to claim 1, wherein the magnets include:
a collimating magnet substantially collimating the ion beam by a pair of parallel magnetic pole surfaces; and
a compensating magnet compensating a divergence in a direction perpendicular to the magnetic pole surface of the ion beam incident to the collimating magnet by a pair of parallel magnetic pole surfaces arranged in parallel to the magnetic pole surfaces of the collimating magnet, wherein
the one or more electron sources are provided in the magnetic field gradient region formed by the compensating magnet, and wherein
assuming that a maximum magnetic flux density generated between the pair of parallel magnetic pole surfaces constituting the compensating magnet is $B_0$ and a magnetic flux density in the magnetic field gradient region formed outside the compensating magnet is B, the one or more electron sources are provided in the magnetic field gradient region satisfying a relationship of $0 < B/B_0 < 1$.

7. The ion beam irradiation device according to claim 6, wherein the one or more electron sources are provided in the magnetic field gradient region satisfying a relationship of $0.30 < B/B_0 < 0.80$.

8. The ion beam irradiation device according to claim 1 wherein the one or more electron sources comprises two or more electron sources and the electron sources are arranged across the ion beam.

9. The ion beam irradiation device according to claim 1, wherein the one or more electron sources are arranged in a plane substantially in parallel to a pair of magnetic pole surfaces constituting the magnets and are arranged along the ion beam on the upstream side and/or downstream side of the magnets.

10. The ion beam irradiation device according to claim 1, wherein each of the one or more electron sources is a field emission type electron source.

11. An ion beam divergence suppressing method suppressing an ion beam divergence by a space charge effect in an ion beam irradiation device irradiating an ion beam to a target, wherein
the ion beam irradiation device includes: an ion source producing an ion beam including positive ions; one or more magnets provided between the ion source and the target for deflecting, converging or diverging the ion beam generated from the ion source to be irradiated to the target; and one or more electron sources producing electrons, wherein
the one or more electron sources are located in a magnetic field gradient region formed on an ion beam upstream side and/or ion beam downstream side of the magnets and located outside a region passed by the ion beam so that the electrons generated from the one or more electron sources are supplied to the magnetic field gradient region wherein,
the magnetic field gradient region is formed within the range of a normalized position from 0 to 2, the normalized position is calculated by dividing a distance from the one or more magnets by an inter-pole gap of the magnets.

* * * * *